US010788916B2

(12) United States Patent
Hong et al.

(10) Patent No.: US 10,788,916 B2
(45) Date of Patent: Sep. 29, 2020

(54) FORCE SENSOR AND DISPLAY DEVICE INCLUDING THE SAME

(71) Applicant: SAMSUNG DISPLAY CO., LTD., Yongin-si, Gyeonggi-Do (KR)

(72) Inventors: Won Ki Hong, Suwon-si (KR); Sung Kook Park, Suwon-si (KR); Hee Seomoon, Hwaseong-si (KR); Tae Hee Lee, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/274,724

(22) Filed: Feb. 13, 2019

(65) Prior Publication Data
US 2020/0042132 A1    Feb. 6, 2020

(30) Foreign Application Priority Data

Jul. 31, 2018   (KR) .................. 10-2018-0089110

(51) Int. Cl.
| | | |
|---|---|---|
| *G06F 3/041* | (2006.01) | |
| *G01L 1/20* | (2006.01) | |
| *H01L 27/32* | (2006.01) | |

(52) U.S. Cl.
CPC .............. *G06F 3/0414* (2013.01); *G01L 1/20* (2013.01); *G06F 3/0412* (2013.01); *H01L 27/323* (2013.01); *G06F 2203/04105* (2013.01)

(58) Field of Classification Search
CPC ................. G06F 3/0414; G06F 3/0412; G06F 2203/04105; G06F 3/044; G01L 1/20; H01L 27/323
See application file for complete search history.

(56) References Cited

U.S. PATENT DOCUMENTS

| | | | |
|---|---|---|---|
| 7,538,760 B2 | 5/2009 | Hotelling et al. | |
| 8,654,524 B2 | 2/2014 | Pance et al. | |
| 8,686,952 B2 | 4/2014 | Burrough et al. | |
| 8,787,006 B2 | 7/2014 | Golko et al. | |
| (Continued) | | | |

FOREIGN PATENT DOCUMENTS

| | | |
|---|---|---|
| EP | 2175344 | 4/2010 |
| EP | 2784630 | 10/2014 |
| (Continued) | | |

OTHER PUBLICATIONS

Extended European Search Report dated Oct. 18, 2019 from the European Patent Office in the corresponding European Application No. 19174988.6.

*Primary Examiner* — Premal R Patel
(74) *Attorney, Agent, or Firm* — F. Chau & Associates, LLC

(57) ABSTRACT

A display device includes a display panel and a force sensor. The force sensor is disposed adjacent to a first edge of the display panel and extends along the first edge. The force sensor includes a first sensing region, a second sensing region, a first force concentration bump, and a second force concentration bump. The second sensing region is located on a side of the first sensing region and has a larger area than the first sensing region. The first force concentration bump overlaps the first sensing region. The second force concentration bump overlaps the second sensing region and is spaced apart from the first force concentration bump.

29 Claims, 37 Drawing Sheets

(56) References Cited

U.S. PATENT DOCUMENTS

| | | | |
|---|---|---|---|
| 2008/0202824 A1 | 8/2008 | Philipp et al. | |
| 2010/0085317 A1* | 4/2010 | Park | G06F 1/1626 |
| | | | 345/173 |
| 2012/0198945 A1 | 8/2012 | Yoneyama | |
| 2013/0228433 A1* | 9/2013 | Shaw | G06F 1/1618 |
| | | | 200/5 A |
| 2014/0028575 A1 | 1/2014 | Parivar et al. | |
| 2014/0085213 A1 | 3/2014 | Huppi et al. | |
| 2014/0091857 A1 | 4/2014 | Bernstein | |
| 2014/0092064 A1 | 4/2014 | Bernstein et al. | |
| 2014/0293145 A1 | 10/2014 | Jones et al. | |
| 2018/0024686 A1* | 1/2018 | Zhou | G06F 3/0412 |
| | | | 345/174 |
| 2018/0210598 A1* | 7/2018 | Lu | G06F 3/0414 |
| 2018/0284512 A1* | 10/2018 | Lee | G06F 1/1686 |
| 2019/0087062 A1* | 3/2019 | Polishchuk | G06F 3/0414 |
| 2019/0302949 A1* | 10/2019 | Ling | G06F 1/1643 |

FOREIGN PATENT DOCUMENTS

| | | |
|---|---|---|
| EP | 2820519 | 4/2018 |
| JP | 6087394 | 2/2017 |
| KR | 10-1792525 | 11/2017 |

\* cited by examiner

FIG. 9

FORCE SENSOR AND DISPLAY DEVICE INCLUDING THE SAME

CROSS-REFERENCE TO RELATED APPLICATION

This U.S. non-provisional patent application claims the benefit of priority under 35 U.S.C. 119 to Korean Patent Application No. 10-2018-0089110, filed on Jul. 31, 2018, in the Korean Intellectual Property Office, the disclosure of which is incorporated by reference in its entirety herein.

BACKGROUND

1. Technical Field

The present disclosure relates to a force sensor and a display device including the same.

2. Discussion of Related Art

Electronic devices that provide images to a user, such as a Smartphone, a tablet personal computer (PC), a digital camera, a notebook computer, a navigation system and a Smart television, include a display device for displaying images. The display device includes a display panel that generates and displays an image and various input devices.

A touch screen including touch sensors can be layered on top of the display panel to recognize touch inputs of a user. Touch screens have been widely applied to Smartphones and tablet PCs. Due to the convenience of receiving input through touch, the touch screen is rapidly replacing existing physical input devices such as keypads.

A force sensor may be made of a material having an electrical characteristic that changes when a force is applied. However, current force sensors cannot be applied to display devices since they cause too much electrical interference with other components of the display device.

SUMMARY

At least one embodiment of the present inventive concept provides a display device including a force sensor which prevents malfunctions due to electrical interference with other components and recognizes force inputs of a user.

At least one embodiment of the present inventive concept provides a force sensor which prevents malfunctions due to electrical interference with other components and recognized force input of a user.

At least one embodiment of the present inventive concept provides a force sensor having improved sensitivity and a display device including the force sensor.

According to an exemplary embodiment of the inventive concept, a display device includes a display panel and a force sensor. The force sensor is disposed adjacent to a first edge of the display panel and extends along the first edge. The force sensor includes a first sensing region, a second sensing region, a first force concentration bump, and a second force concentration bump. The second sensing region is located on a side of the first sensing region and has a larger area than the first sensing region. The first force concentration bump overlaps the first sensing region. The second force concentration bump overlaps the second sensing region and is spaced apart from the first force concentration bump.

According to an exemplary embodiment of the inventive concept, a display device includes a display panel and a force sensor. The force sensor is disposed adjacent to a first edge of the display panel, extends along the first edge, and includes a recess disposed at an inner side of the force sensor. The force sensor includes a plurality of first sensing regions disposed on a first side of the recess, a second sensing region disposed on a second side of the recess and having a larger area than each of the first sensing regions, a first force concentration bump disposed on the first side of the recess and overlapping each of the first sensing regions, and a second force concentration bump overlapping the second sensing region and having a larger area than the first force concentration bump.

According to an exemplary embodiment of the inventive concept, a force sensor includes a plurality of first sensing regions, a second sensing region, a first concentration bump, and a second concentration bump. The first sensing regions are disposed on a first side of a recess of the force sensor and are configured to sense application of a force. The second sensing region is disposed on a second side of the recess, is configured to sense application of a force, and has a larger area than each of the first sensing regions. The first force concentration bump overlaps each of the first sensing regions. The second force concentration bump overlaps the second sensing region and is spaced apart from the first force concentration bump.

BRIEF DESCRIPTION OF THE DRAWINGS

The inventive concept will become apparent and more readily appreciated from the following description of the embodiments therein, taken in conjunction with the accompanying drawings in which:

FIG. 9 is a layout view of a first force sensor and a second force sensor according to an exemplary embodiment of the inventive concept;

DETAILED DESCRIPTION OF THE EXEMPLARY EMBODIMENTS

Figure 1:
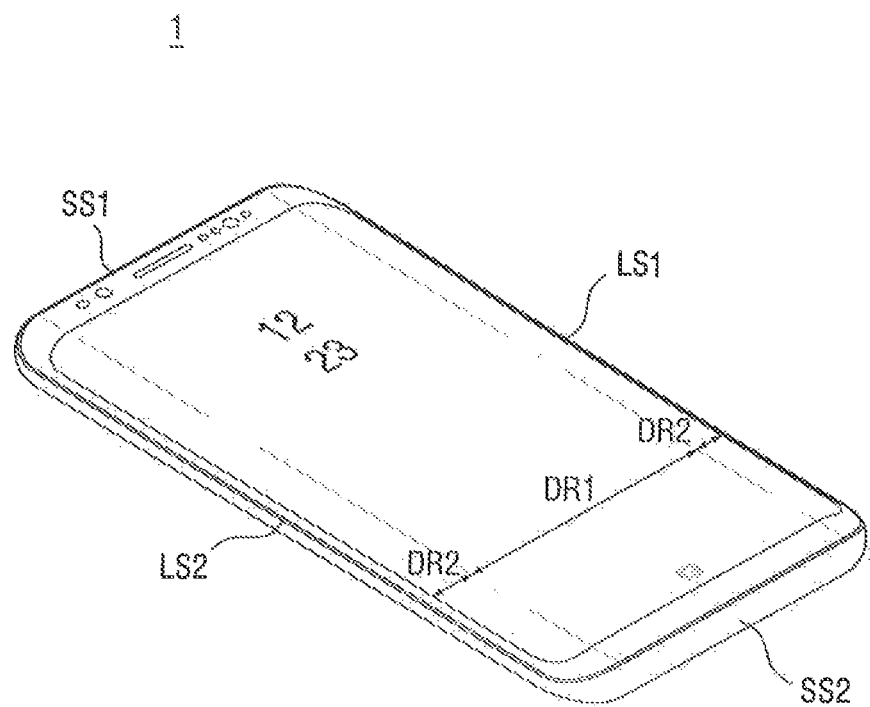
FIG. 1 is a perspective view of a display device according to an exemplary embodiment of the inventive concept.

Exemplary embodiments of the inventive concept will be described more fully hereinafter with reference to the accompanying drawings. Like reference numerals refer to like elements throughout the accompanying drawings.

It will be understood that when a layer is referred to as being "on" another layer or substrate, it can be directly on the other layer or substrate, or intervening layers may also be present. As used herein, the singular forms "a", "an" and "the" are intended to include the plural forms as well, unless the context clearly indicates otherwise.

Figure 2:
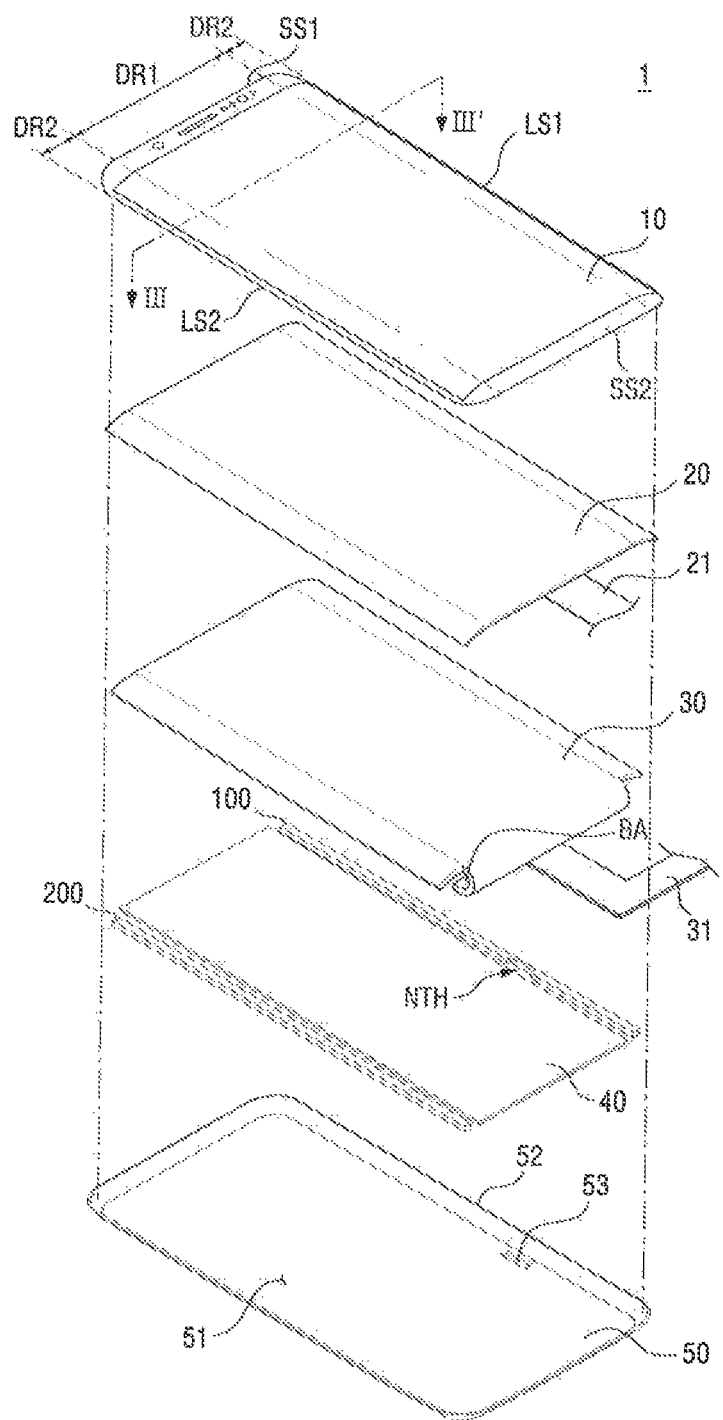
FIG. 2 is an exploded perspective view of the display device according to the embodiment.
Figure 3:
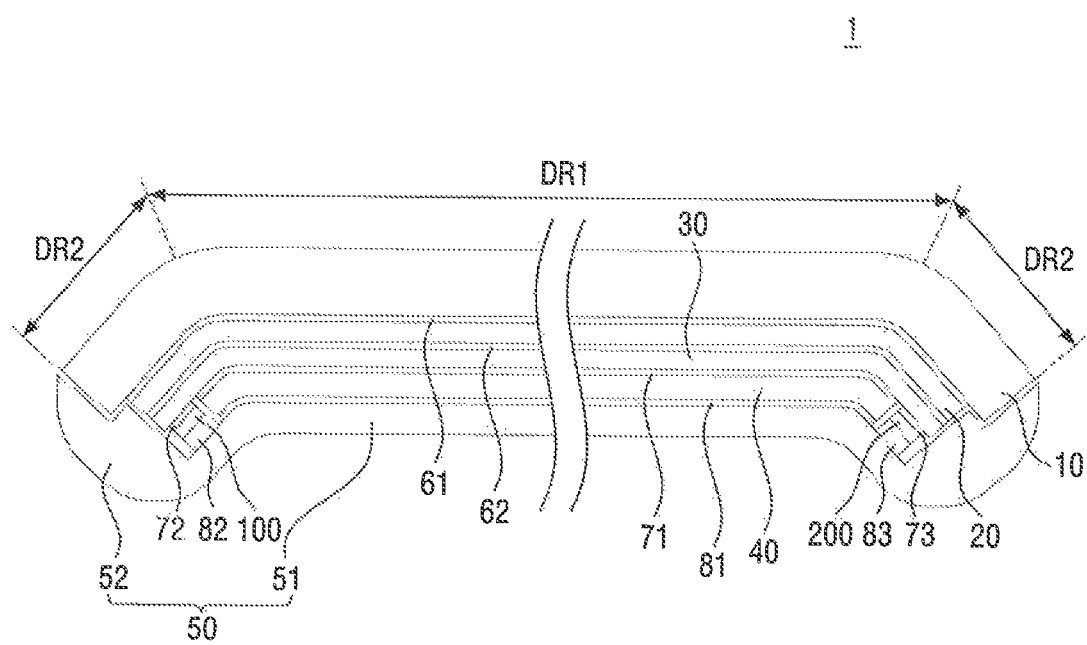
FIG. 3 is a cross-sectional view taken along line III-III' of FIG. 2.

FIG. 1 is a perspective view of a display device 1 according to an exemplary embodiment of the inventive concept. FIG. 2 is an exploded perspective view of the display device 1 according to the embodiment. FIG. 3 is a cross-sectional view taken along line III-III' of FIG. 2.

Referring to FIGS. 1 through 3, the display device 1 includes a display panel 30 and force sensors 100 and 200 disposed near edges of the display panel 30. For example, the edges may be opposing edges. In an embodiment, the force sensor 100 is adjacent one of the opposing edges without extending past the one edge and the force sensor 200 is adjacent the second other opposing edge without extending past the second edge. In an embodiment, the display device 1 further includes a window 10 disposed above the display panel 30, a cover panel sheet 40 disposed below the display panel 30, and a bracket 50 (or a middle mold frame) disposed below the cover panel sheet 40.

Unless otherwise defined, the terms "above" and "upper surface" in a thickness direction, as used herein, denote a display surface side of the display panel 30, and the terms "below" and "lower surface" in the thickness direction, as used herein, denote an opposite side of the display panel 30 from the display surface side. In addition, the terms "above (upper)," "below (lower)," "left," and "right" in a planar direction refer to directions when a display surface placed in position is viewed from above.

In an embodiment, the display device 1 has a substantially rectangular shape in a plan view. For example, the display device 1 may be shaped like a rectangle with right-angled corners or a rectangle with round corners in a plan view. The display device 1 includes two long sides LS1 and LS2 and two short sides SS1 and SS2. For example, a length of sides LS1 and LS2 are greater than a length of sides SS1 and SS2. In an embodiment, sides LS1 and LS2 have the same length as one another, and sides SS1 and S2 have the same length as one another. In the rectangular display device 1 or members such as the display panel 30 included in the rectangular display device 1, a long side located on a right side in a plan view will be referred to as a first long side LS1, a long side located on a left side in the plan view will be referred to as a second long side LS2, a short side located on an upper side in the plan view will be referred to as a first short side SS1, and a short side located on a lower side in the plan view will be referred to as a second short side SS2. In an exemplary embodiment of the inventive concept, the long sides LS1 and LS2 of the display device 1 are about 1.5 to 2.5 times longer than the short sides SS1 and SS2.

The display device 1 includes a first area DR1 and a second area DR2 lying in different planes. The first area DR1 lies in a first plane. The second area DR2 is connected to the first area DR1, but is bent or curved from the first area DR1. The second area DR2 may lie in a second plane located at a predetermined crossing angle to the first plane or may have a curved surface. The second area DR2 of the display device 1 is disposed around the first area DR1. The first area DR1 of the display device 1 is used as a main display surface. The second area DR2 as well as the first area DR1 can be used as a display area of the display device 1. A case where the first area DR1 of the display device 1 is a flat portion and the second area DR2 is a curved portion will be described below as an example.

The second area DR2, which is the curved portion, may have a constant curvature or a varying curvature.

The second area DR2 may be disposed at edges of the display device 1. In an embodiment, the second area DR2 may be disposed at both long edges (long sides LS1 and LS2) of the display device 1 which face each other. Alternatively, the second area DR2 may be disposed at one edge, at both short edges (short sides SS1 and SS2), at three edges, or at all edges of the display device 1. In an embodiment, the second area DR2 includes a first subarea and a second subarea, where the first subarea is disposed adjacent the first long side LS1, the second subarea is disposed adjacent the second long side LS2, and the first area DR1 is disposed between the first and second subareas.

The display panel 30 is a panel for displaying images and may be, for example, an organic light emitting display panel. In the following embodiments, a case where an organic light emitting display panel is applied as the display panel 30 will be described as an example. However, other types of display panels such as a liquid crystal display panel and an electrophoresis display panel may also be applied. In an embodiment, a display flexible circuit board 31 is coupled to the display panel 30.

The display panel 30 includes a plurality of organic light emitting elements disposed on a substrate. In an embodiment, the substrate is a rigid substrate made of glass or quartz. In another embodiment, the substrate is a flexible substrate made of polyimide or a polymer resin. When a polyimide substrate is applied as the substrate, the display panel 30 can be bent or curved, folded, or rolled. In the drawings, the second short side SS2 of the display panel 30 is bent. In an embodiment where the second short side SS2 is bent, the display flexible circuit board 31 is attached to a bending area BA of the display panel 30. In an embodiment, the bending area BA is a part of a flexible substrate that is bent and curved away from an upper surface of the display panel 30, and the display flexible circuit 31 is connected to a bottom surface of the part.

The window 10 is disposed above the display panel 30. The window 10 is disposed above the display panel 30 to protect the display panel 30 and transmit light emitted from the display panel 30. The window 10 may be made of glass or transparent plastic.

The window 10 may be disposed to overlap the display panel 30 and cover the entire surface of the display panel 30. In an embodiment, the window 10 is larger than the display panel 30. For example, the window 10 may protrude outward from the display panel 30 at both short sides SS1 and SS2 of the display device 1. The window 10 may also protrude from the display panel 30 at both long sides LS1 and LS2 of the display device 1. However, the protruding distance of the window 10 may greater at both short sides SS1 and SS2.

In an exemplary embodiment, the display device 1 further includes a touch member 20 disposed between the display panel 30 and the window 10. The touch member 20 may be of a rigid panel type, a flexible panel type, or a film type. In an embodiment, the touch member 20 is substantially the same size as the display panel 30 and overlaps the display panel 30. Side surfaces of the touch member 20 may be, but are not necessarily, aligned with side surfaces of the display panel 30 at all sides excluding the bent short side SS2 of the display panel 30. The display panel 30 and the touch member 20, and the touch member 20 and the window 10 may be bonded together respectively by transparent bonding layers 62 and 61 such as optically clear adhesives (OCA) or optically clear resins (OCR). For example, a transparent bonding layer 62 may bond the display panel 30 to the touch member 20, and a transparent bonding layer 61 may bond the touch member 20 to the window 10. A touch flexible circuit board 21 may be coupled to the touch member 20. The touch member 20 may include one or more touch electrodes or touch sensors. In an exemplary embodiment, the touch electrodes or touch sensors are capable of sensing a touch using capacitive sensing. In another embodiment, the touch electrodes or touch sensors are capable of sensing a touch using resistive touch sensing.

In an embodiment, the touch member 20 is omitted. In an embodiment where the touch member 20 is omitted, the display panel 30 and the window 10 may be bonded together by an OCA or an OCR. In an embodiment, the display panel 30 includes a touch electrode portion. In an embodiment, the touch electrode portion is disposed directly on the display panel 30. For example, when the display panel 30 includes a thin-film encapsulation layer covering the organic light emitting elements, the touch electrode portion is disposed on the thin-film encapsulation layer. In an embodiment where the display panel 30 includes a rigid encapsulation substrate, the touch electrode portion is disposed on the encapsulation substrate.

The cover panel sheet 40 and the force sensors 100 and 200 (or pressure sensors) are disposed below the display panel 30. In an embodiment, the cover panel sheet 40 and the force sensors 100 and 200 are attached to a lower surface of the display panel 30 respectively by bonding layers 71, 72 and 73 such as force-sensitive adhesive layers or adhesive layers.

The cover panel sheet 40 is disposed to overlap a central portion of the display panel 30. The cover panel sheet 40 has a size substantially similar to that of the display panel 30 but may expose the lower surface of the display panel 30 by a predetermined width in the vicinity of both long sides LS1 and LS2 where the force sensors 100 and 200 are disposed.

The cover panel sheet 40 may perform a heat dissipating function, an electromagnetic wave shielding function, a pattern detection preventing function, a grounding function, a buffering function, a strength enhancing function and/or a digitizing function. The cover panel sheet 40 may include a functional layer having at least one of the above functions. The functional layer may be provided in various forms such as a layer, a membrane, a film, a sheet, a plate, and a panel. The cover panel sheet 40 may include one functional layer or a plurality of functional layers. In an embodiment, the cover panel sheet 40 includes a buffer sheet, a graphite sheet, and a copper sheet stacked sequentially from top to bottom.

The force sensors 100 and 200 may be disposed to overlap at least one edge of the display panel 30. A plurality of force sensors 100 and 200 may be provided. As illustrated in the drawings, the force sensors 100 and 200 include a first force sensor 100 overlapping a first long edge (first long side LS1) of the display panel 30 and a second force sensor 200 overlapping a second long edge (second long side LS2) of the display panel 30. In FIG. 2, the force sensors 100 and 200 are disposed in the second area DR2 (i.e., the curved portion) of the display device 1. For example, when the second area DR2 is divided into first and second subareas, the first sensor 100 may be disposed in the first subarea, the second force sensor 200 may be disposed in the second subarea, and the first area DR1 is disposed between the subareas. However, the force sensors 100 and 200 are disposed in the second area DR2 in alternate embodiments. In an exemplary embodiment, any one of the force sensor 100 and 200 is omitted.

The first and second force sensors 100 and 200 may respectively be attached to portions of the lower surface of the display panel 30 near both long edges (long sides LS1 and LS2) of the display panel 30 exposed by the cover panel sheet 40. In an embodiment, the force sensors 100 and 200 are disposed in the second area DR2 of the display device 1 and are not disposed in the first area DR1. However, embodiments of the present disclosure are not limited to this case. For example, the force sensors 100 and 200 may be disposed in the second area DR2 and extended in a width direction to a part of the first area DR1. For example, the force sensors 100 and 200 may extend to overlap part of the first area DR1.

Although the force sensors 100 and 200 are overlapped by the display panel 30, an area of the display panel 30 which overlaps the force sensors 100 and 200 may be, in an embodiment, a non-display area around the display area. An outermost black matrix may be disposed in the non-display area of the display panel 30 around the display area. In addition, although the force sensors 100 and 200 are overlapped by the touch member 20, an area of the touch member 20 which overlaps the force sensors 100 and 200 may be a peripheral area where a touch electrode is not disposed. However, embodiments of the present disclosure are not limited to the above case. In an embodiment, the area of the display panel 30 which overlaps the force sensors 100 and 200 is the display area where an image is displayed. In addition, a touch electrode may also be disposed in the area of the touch member 20 which overlaps the force sensors 100 and 200.

In an embodiment, the force sensors 100 and 200 and the cover panel sheet 40 do not overlap in the thickness direction. In an embodiment, the force sensors 100 and 200 do not overlap the cover panel sheet 40 in a plan view. The force sensors 100 and 200 will be described in detail later.

The bracket 50 is disposed below the force sensors 100 and 200 and the cover panel sheet 40. The bracket 50 may be a storage container or a protective container for housing other components. For example, the bracket 50 may house the window 10, the touch member 20, the display panel 30, the force sensors 100 and 200, and the cover panel sheet 40.

In an embodiment, the bracket 50 includes a bottom portion 51 and sidewalls 52 extending from sides of the bottom portion 51.

The bottom portion 51 of the bracket 50 faces the force sensors 100 and 200 and the cover panel sheet 40. In an embodiment, the force sensors 100 and 200 and the cover panel sheet 40 are attached to the bottom portion 51 of the bracket 50 respectively by bonding layers 82, 83 and 81 such as force-sensitive adhesive layers or adhesive layers. In an embodiment, the bonding layers 82 and 83 which attach the force sensors 100 and 200 to the bottom portion 51 of the bracket 50 are waterproof tapes.

The sidewalls 52 of the bracket 50 face side surfaces of the touch member 20, the display panel 30, the force sensors 100 and 200, and the cover panel sheet 40. Upper ends of the sidewalls 52 of the bracket 50 face the window 10. An outer surface of the bracket 50 may be aligned with an outer surface of the window 10. The window 10 may be attached to the bracket 50 with a waterproof tape (not illustrated).

The bracket 50 may include a connect hole 53, through which a display connector 35 (see FIG. 4) passes, near the first long edge (first long side LS). The connect hole 53 may penetrate the bottom portion 51 of the bracket 50 in the thickness direction and may have a slit shape. For example, the connect hole 53 may be a through hole of the bottom portion 51. For example, the connected hole 53 may have a rectangular shape. In an embodiment, the first force sensor 100 has a notch-shaped recess NTH near the connect hole 53 of the bracket 50. This will be described in detail with reference to FIGS. 4 and 5.

Figure 4:
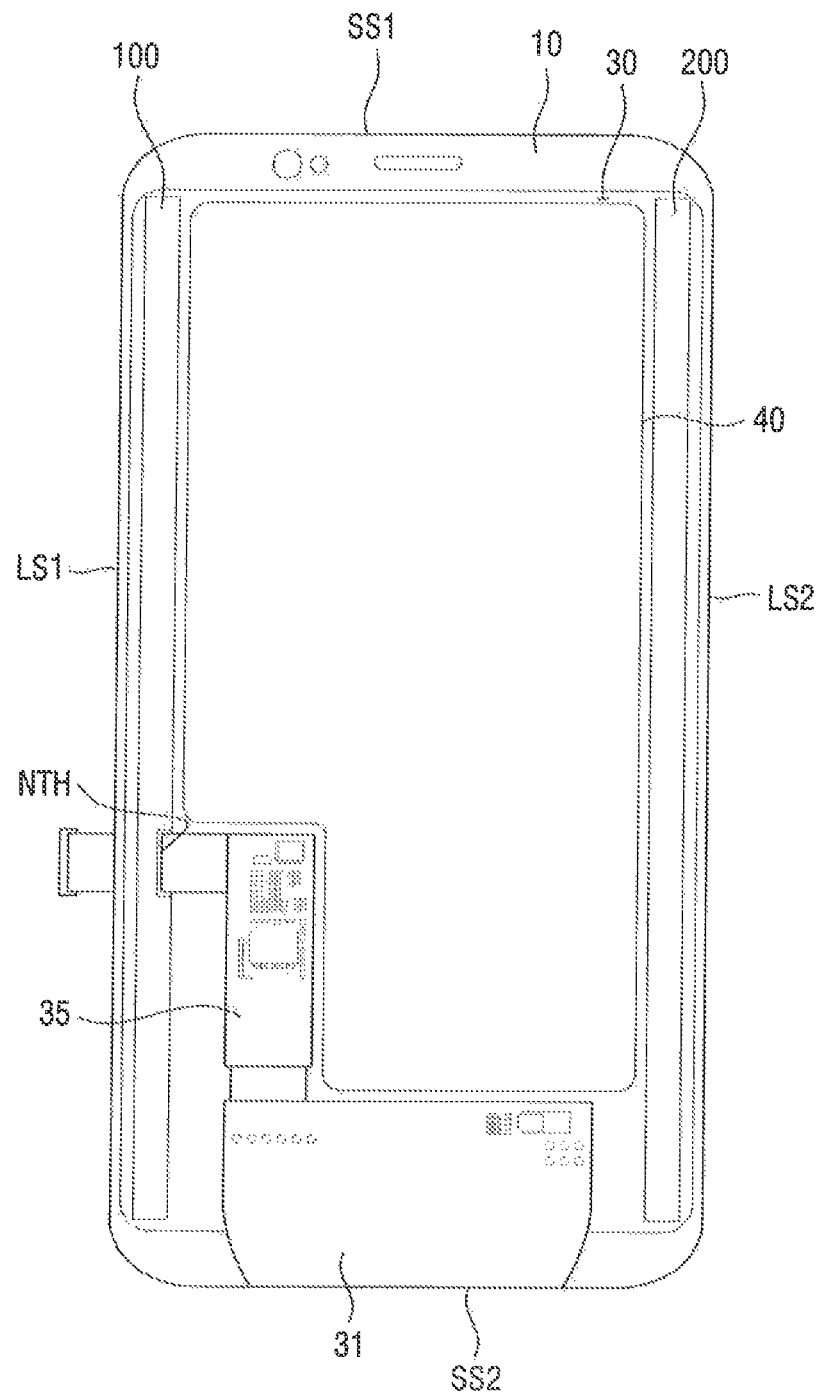
FIG. 4 is a bottom view of the display device according to the embodiment.
Figure 5:
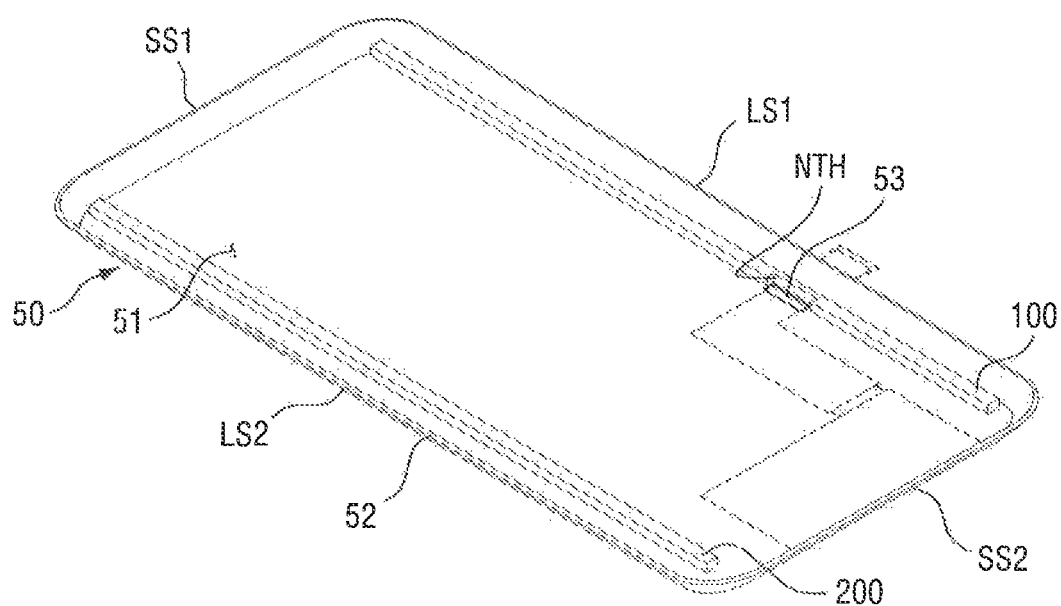
FIG. 5 is a perspective view illustrating the arrangement of a bracket and force sensors according to an exemplary embodiment of the inventive concept.

FIG. 4 is a bottom view of the display device 1 according to the embodiment. FIG. 4 illustrates the bottom shape of the display device 1 excluding the bracket 50. In FIG. 4, the display device 1 is turned upside down. Thus, the left and right sides are reversed, and the positions of the first long side LS1 and the second long side LS2 are also reversed. FIG. 5 is a perspective view illustrating the arrangement of the bracket 50 and the force sensors 100 and 200 according to an embodiment of the inventive concept.

Referring to FIGS. 4 and 5, the display flexible circuit board 31 is connected to the display connector 35. The display flexible circuit board 31 is housed in the bracket 50, but the display connector 35 comes out of the bracket 50 through the connect hole 53 so as to be connected to an external terminal. When the first force sensor 100 overlaps or physically contacts a space through which the display connector 35 comes out, there is a possibility that the first force sensor 100 will malfunction. Therefore, the first force sensor 100 may have the recess NTH at a corresponding position to avoid interfering with the display connector 35. Since the first force sensor 100 is recessed outward due to the recess NTH, it does not overlap or physically contact the display connector 35 passing through the connect hole 53. The recess NTH of the first force sensor 100 disposed in the bracket 50 may have a shape bypassing the connect hole 53 in an outward direction.

The display connector 35 may be made of a flexible circuit board. Although the display flexible circuit board 31 and the display connector 35 are formed as separate members and connected to each other in the drawings, the display flexible circuit board 31 itself may also pass through the connect hole 53.

In an exemplary embodiment, unlike the first force sensor 100, the second force sensor 200 does not include a notch-shaped recess.

The force sensors 100 and 200 will now be described in more detail.

Figure 6:
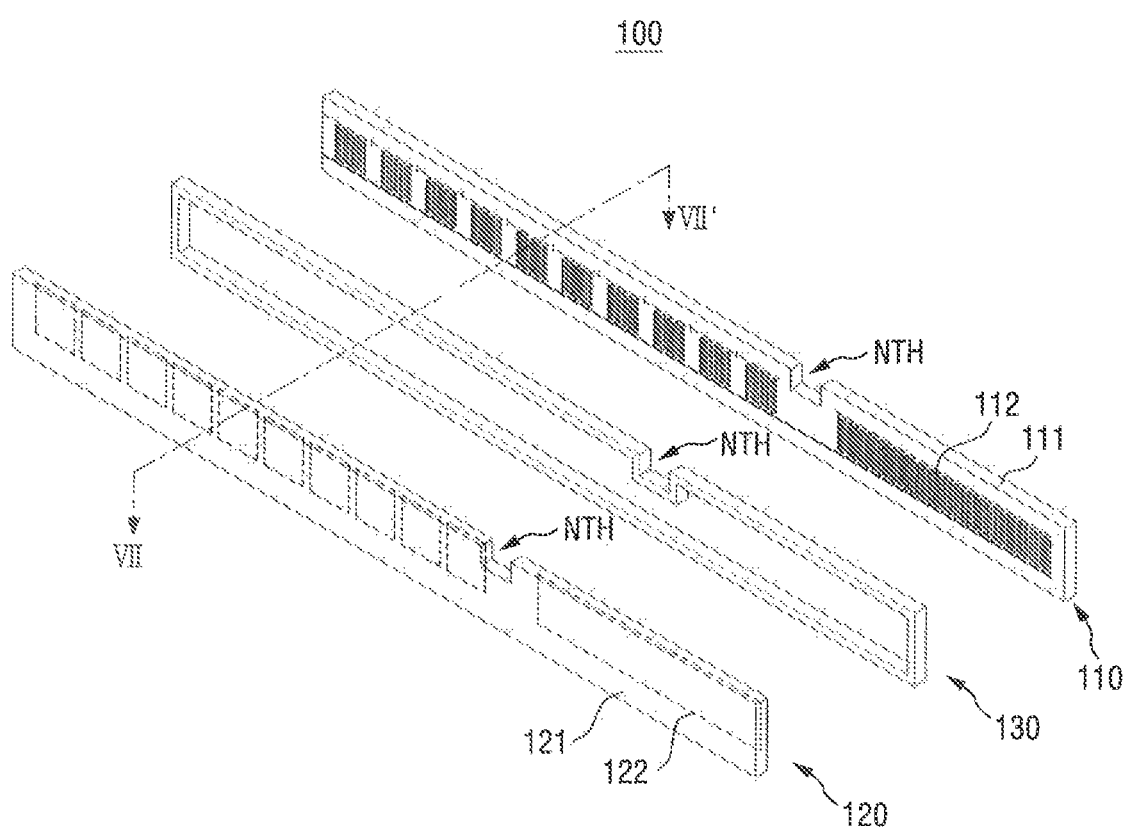
FIG. 6 is an exploded perspective view of a first force sensor according to an exemplary embodiment of the inventive concept.
Figure 7:
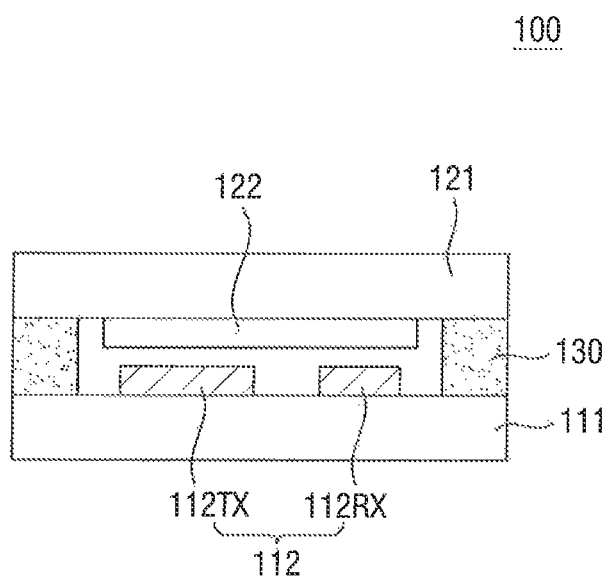
FIG. 7 is a cross-sectional view taken along line VII-VII' of FIG. 6.
Figure 8:
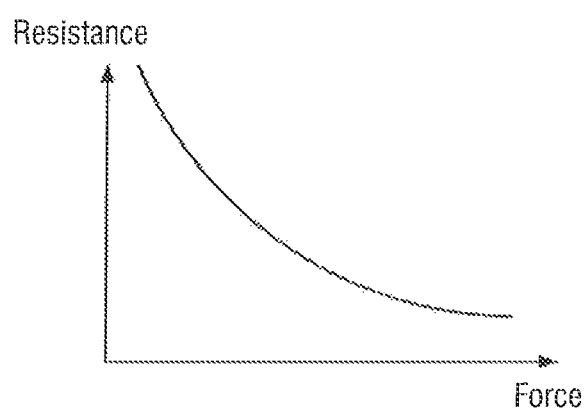
FIG. 8 is a graph illustrating the electrical resistance of a force sensing layer to force.

FIG. 6 is an exploded perspective view of the first force sensor 100 according to an embodiment of the inventive concept. FIG. 7 is a cross-sectional view taken along line VII-VII' of FIG. 6. FIG. 8 is a graph illustrating the electrical resistance of a force sensing layer 122 to force. In FIGS. 6 through 8, the structure and operation of the first force sensor 100 are described as an example. However, the second force sensor 200 also has substantially the same structure as the first force sensor 100 except for the recess NTH.

Referring to FIGS. 6 through 8, the first force sensor 100 extends in one direction in a plane. The length of the first force sensor 100 in the extending direction is much greater than the width of the first force sensor 100. In an embodiment, the width of the first force sensor 100 ranges from about 2 mm to about 6 mm. In an embodiment, the length of the first force sensor 100 is the same as or substantially the same as the length of the long sides LS1 and LS2 of the display device 1. The length of the first force sensor 100 may be, but is not limited to, about 80% to about 98% of the length of the long sides LS1 and LS2 of the display device 1. In an embodiment, the length of the first force sensor 100 is in the range of about 50 mm to about 300 mm. For example, the length of the first force sensor may be in the range of about 100 mm to about 150 mm.

The first force sensor 100 includes a first substrate 110 and a second substrate 120 facing each other. The first substrate 110 includes a first base 111 (e.g., a substrate) and an electrode layer 112. The second substrate 120 includes a second base 121 (e.g., a substrate) and the force sensing layer 122. The first substrate 110 and the second substrate 120 are bonded together by a bonding layer 130. Each of the first substrate 110 and the second substrate 120 may be, but is not limited to, a film.

Each of the first base 111 and the second base 121 may include a polyethylene, polyimide, polycarbonate, polysulfone, polyacrylate, polystyrene, polyvinyl chloride, polyvinyl alcohol, polynorbornene, or polyester-based material. In an embodiment, each of the first base 111 and the second base 121 is made of a polyethylene terephthalate (PET) film or a polyimide film.

The electrode layer 112 is disposed on a surface of the first base 111. Here, the surface of the first base 111 is a surface facing the second base 121. In an embodiment, the thickness of the electrode layer 112 ranges from about 2 μm to about 8 μm. For example, the thickness of the electrode layer 112 may be about 4 μm. The electrode layer 112 includes a first electrode 112TX and a second electrode 112RX. In an embodiment, the first electrode 112TX is a driving electrode, and the second electrode 112RX is a sensing electrode. The first electrode 112TX and the second electrode 112RX may be disposed adjacent to each other, but are spaced apart from each other so as not to short-circuit.

In an embodiment, the first electrode 112TX and the second electrode 112RX are disposed on the same layer. The first electrode 112TX and the second electrode 112RX may be made of the same material. For example, the first electrode 112TX and the second electrode 112RX may include a conductive material such as silver (Ag) or copper (Cu). The first electrode 112TX and the second electrode 112RX may be formed by a screen printing method.

The force sensing layer 122 is disposed on a surface of the second base 121. Here, the surface of the second base 121 is a surface facing the first base 111. The force sensing layer 122 includes a force sensitive material. The force sensitive material may include metal nanoparticles such as nickel, aluminum, tin or copper, or may include carbon. The force sensitive material may be provided in polymer resin in the form of, but not limited to, particles. As illustrated in FIG. 8, the electrical resistance of the force sensing layer 122 decreases as the force increases. By using this characteristic, it is possible to sense whether a force (e.g., physical force) has been applied as well as the magnitude of the force.

Specifically, a surface of the force sensing layer 122 is in contact with or at least adjacent to surfaces of the first electrode 112TX and the second electrode 112RX. When a force is applied to the first force sensor 100, the surface of the force sensing layer 122 is brought into contact with the surfaces of the first electrode 112TX and the second electrode 112RX at a corresponding portion. Therefore, the first electrode 112TX and the second electrode 112RX may be physically connected by the force sensing layer 122. The force sensing layer 122 lying between the first electrode 112TX and the second electrode 112RX may act as an electrical resistor.

When no or little force is applied to the force sensing layer 122, the force sensing layer 122 has a high resistance. In this case, even if a driving voltage is applied to the first electrode 112TX, a current hardly flows to the second electrode 112RX. On the other hand, when a large force is applied to the force sensing layer 122, the resistance of the force sensing layer 122 is reduced, thus increasing the amount of current flowing between the first electrode 112TX and the second electrode 112RX. In an exemplary embodiment, a voltage generator is provided in the display device to provide a driving voltage(s) to the first electrode(s) 112TX, and a reading circuit is provided in the display device to read a sensing voltage(s) or a sensing current(s) of the second electrode(s) 112RX.

Therefore, by sensing the amount of current or voltage at the second electrode 112RX after applying a driving voltage to the first electrode 112TX, it is possible to identify how much force has been applied to the force sensing layer 122.

The force sensing layer 122 may be, but is not limited to, thicker than the electrode layer 112. In an embodiment, the thickness of the force sensing layer 122 ranges from about 4 μm to about 12 μm. For example, the thickness of the force sensing layer 122 may be about 8 μm.

The first force sensor 100 may further include the bonding layer 130 disposed between the first base 111 and the second base 121 to bond the first base 111 and the second base 121. The bonding layer 130 may be disposed along the periphery of the first base 111 and the second base 121. In an embodiment, the bonding layer 130 completely surrounds the periphery of the first base 111 and the second base 121 to seal the first force sensor 100. That is, the bonding layer 130 may serve as a gasket. Further, the bonding layer 130 may also serve as a spacer that maintains a constant gap between the first base 111 and the second base 121. In an embodiment, the bonding layer 130 does not overlap the electrode layer 112 and the force sensing layer 122.

In an embodiment, the thickness of the bonding layer 130 is in the range of about 5 μm to about 50 μm. For example, the thickness may be in the range of about 12 μm to about 30 μm.

The bonding layer 130 may be made of a force-sensitive adhesive layer or an adhesive layer. The bonding layer 130 may first be attached to one of the surface of the first base 111 and the surface of the second base 121 and then attached to the surface of the other base 111 or 121 in the process of assembling the first base 111 and the second base 121. Alternatively, a bonding layer may be provided on each of the surface of the first base 111 and the surface of the second base 121, and then the bonding layer of the first base 111 and the bonding layer of the second base 121 may be bonded together in the process of assembling the first base 111 and the second base 121.

The first force sensor 100 may be placed in the display device 1 such that the first base 111 having the electrode layer 112 faces the display panel 30. That is, the other surface (outer surface) of the first base 111 may be attached to the lower surface of the display panel 30, and the other surface (outer surface) of the second base 121 may be attached to the bracket 50. However, embodiments of the present disclosure are not limited to this case, and the placement directions of the first base 111 and the second base 121 in the display device 1 may also be opposite to the directions described above.

Figure 9:
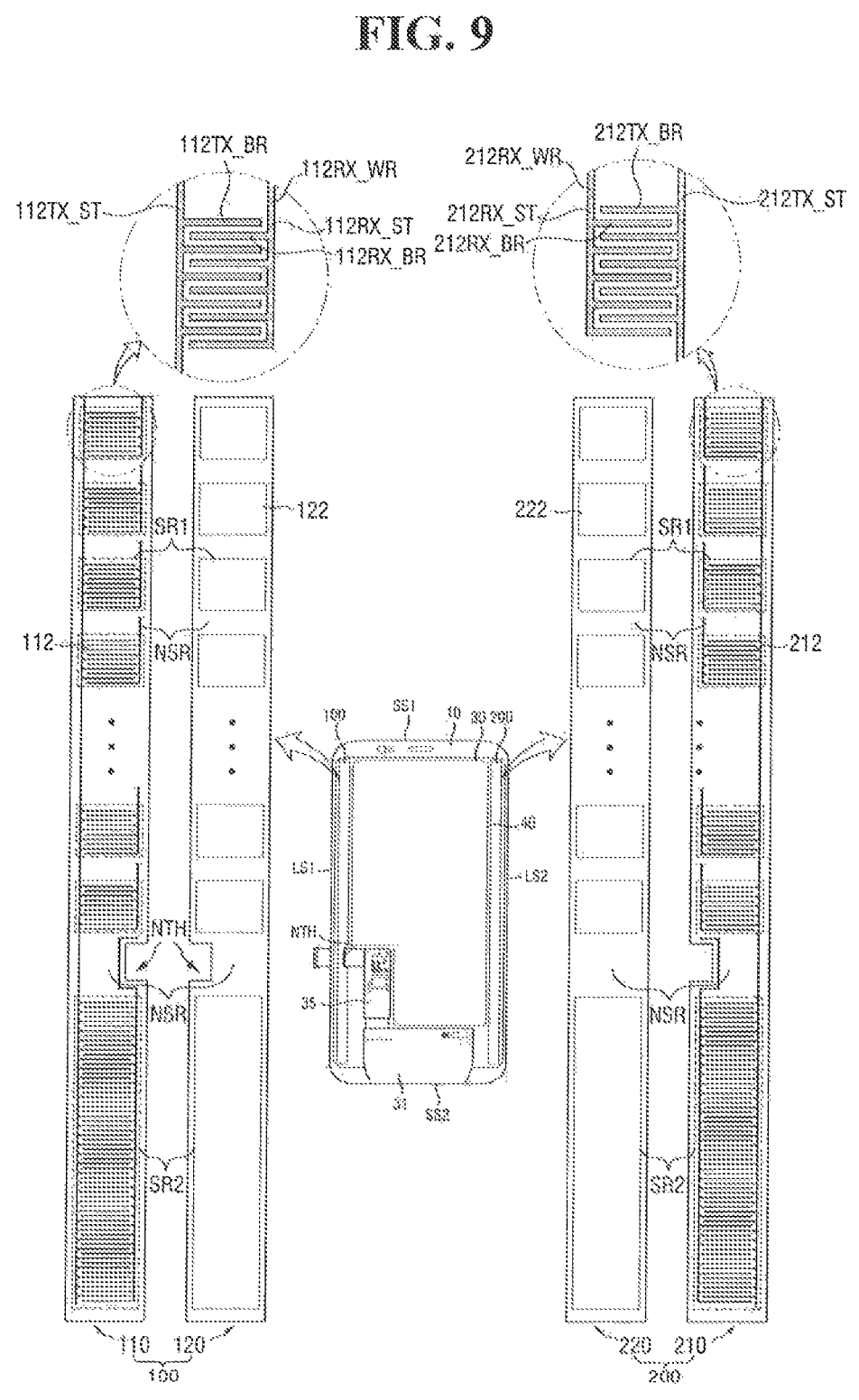

FIG. 9 is a layout view of the first force sensor 100 and the second force sensor 200 according to an exemplary embodiment of the inventive concept.

A layout view of the first substrate 110 and the second substrate 120 of the first force sensor 100 is illustrated on the left side of FIG. 9, and a layout view of a first substrate 210 and a second substrate 220 of the second force sensor 200 is illustrated on the right side of FIG. 9.

Referring to FIG. 9, each of the first force sensor 100 and the second force sensor 200 includes a plurality of sensing regions SR1 and SR2. The sensing regions SR1 and SR2 are regions capable of sensing forces. The sensing regions SR1 and SR2 may sense forces at their corresponding positions independently of each other.

The sensing regions SR1 and SR2 may be arranged in a longitudinal direction of each of the first force sensor 100 and the second force sensor 200. In an embodiment, the sensing regions SR1 and SR2 are arranged in a row or a column. Neighboring sensing regions SR1 and SR2 may be arranged continuously. Alternatively, the neighboring sensing regions SR1 and SR2 may be spaced apart from each other. That is, a non-sensing region NSR may be disposed between the sensing regions SR1 and SR2.

The first electrode 112TX or 212TX, the second electrode 112RX or 212RX and the force sensing layer 122 or 222 are disposed in each of the sensing regions SR1 and SR2. While the second electrode 112RX or 212RX serving as a sensing electrode is a separate cell electrode disposed in each of the sensing regions SR1 and SR2, the first electrode 112TX or 212TX serving as a driving electrode is a common electrode, all portions of which are electrically connected regardless of the sensing regions SR1 and SR2. The force sensing layer 122 or 222 may also be patterned into separate segments respectively disposed in the sensing regions SR1 and SR2.

In an exemplary embodiment, the first force sensor 100 includes a driving electrode (e.g., 112TX) that spans all the sensing regions SR1 and the SR2 (i.e., the driving electrode is common to all the sensing regions), and a plurality of sensing electrodes (e.g., 112RX), where each sensing region among the sensing regions SR1 and SR2 includes one of the sensing electrodes, and the sensing electrodes are electrically disconnected from one another.

The sensing regions SR1 and SR2 may have different areas depending on their use. For example, the area of a second sensing region SR2 (a squeezing sensing region) that senses a squeezing force may be larger than the area of a first sensing region SR1 (a pressing sensing region) used in place of a physical button. In an embodiment, the second sensing region SR2 has the same width as the first sensing region SR1 but has a greater length (width in the extending direction of a force sensor) than the first sensing region SR1. In an embodiment, the length of the second sensing region SR2 is about three to fifteen times the length of the first sensing region SR1. For example, the length of the first sensing region SR1 may be about 4 mm to about 5 mm, and the length of the second sensing region SR2 may be about 30 mm to about 60 mm.

In an embodiment, a plurality of first sensing regions SR1 are arranged from an upper end toward a lower end of each of the first force sensor 100 and the second force sensor 200, and one second sensing region SR2 is disposed near the lower end of each of the first force sensor 100 and the second force sensor 200. For example, the one second sensing region SR2 may be disposed near the last one of the first sensing region SR1. The positions of the first sensing regions SR1 and the second sensing region SR2 in the first force sensor 100 may be distinguished based on the recess NTH. For example, the first sensing regions SR1 may be disposed above the recess NTH, and the second sensing region SR2 may be disposed below the recess NTH. The number of the first sensing regions SR1 disposed above the recess NTH may be selected from, but not limited to, the range of 2 to 20 or the range of 5 to 15. Although the second force sensor 200 does not have the recess NTH, it may have the first sensing regions SR1 and the second sensing region SR2 at positions corresponding to the first sensing regions SR1 and the second sensing region SR2 of the first force sensor 100. The sensing regions SR1 and SR2 of the first force sensor 100 and the sensing regions SR1 and SR2 of the second force sensor 200 may be, but are not limited to, substantially symmetrical in terms of number, area, spacing, position, etc.

The recess NTH of the first force sensor 100 may be located in the middle or below the middle of the first force sensor 100 in the longitudinal direction of the first force sensor 100, as illustrated in FIG. 9. For example, a distance from the lower end of the first force sensor 100 to the recess NTH in a plan view may be about 30% to about 50% of the total length of the first force sensor 100. In an embodiment, the distance from the lower end of the first force sensor 100 to the recess NTH ranges from about 50 mm to about 60 mm.

When the first force sensor 100 is placed in the display device 1, if a long side positioned on an outer side of the display device 1 is defined as an outer side and a long side positioned on an inner side of the display device 1 is defined as an inner side, the recess NTH is formed at the inner side of the first force sensor 100. In an embodiment, the width of the recess NTH recessed inward from the inner side of the first force sensor 100 ranges from about 1 mm to about 4 mm. For example, the width of the recess NTH may be about 2 mm. The length of the recess NTH may be, but is not limited to, equal to the width of the recess NTH. The length of the recess NTH may be equal to or greater than that of the connect hole 53. When the first force sensor 100 is placed in the display device 1, a recessed region of the recess NTH may overlap the connect hole 53. The recessed shape of the recess NTH may be a rectangular shape or a square shape. However, the recessed shape of the recess NTH is not limited to the rectangular shape or the square shape and may also include a concave curve.

In an embodiment, the first electrode 112TX or 212TX and the second electrode 112RX or 212RX of each of the first and second force sensors 100 and 200 are comb-shaped electrodes, respectively. The first electrode 112TX or 212TX and the second electrode 112RX or 212RX may be arranged such that the comb shapes are engaged with each other.

Specifically, the first electrode 112TX or 212TX and the second electrode 112RX or 212RX may each include a stem electrode (or a connection electrode) and branch electrodes (or finger electrodes). The first electrode 112TX or 212TX and the second electrode 112RX or 212RX may be arranged such that the branch electrodes are alternately disposed. This arrangement increases an area where the first electrode 112TX or 212TX and the second electrode 112RX or 212RX face each other, thereby enabling effective force sensing.

More specifically, the first electrode 112TX or 212TX of each of the first and second force sensors 100 and 200 is structured to include a first stem electrode 112TX_ST or 212TX_ST extending in the longitudinal direction and a plurality of first branch electrodes 112TX_BR or 212TX_BR branching in the width direction from the first stem electrode 112TX_ST or 212TX_ST.

The first stem electrode 112TX_ST or 212TX_ST is disposed over the sensing regions SR1 and SR2 to provide a voltage (a driving voltage) to the sensing regions SR1 and SR2. The first stem electrode 112TX_ST or 212TX_ST is also disposed in the non-sensing region NSR between neighboring sensing regions SR1 and SR2 to electrically connect portions of the first stem electrode 12TX_ST or 212TX_ST which are disposed in the neighboring regions SR1 and SR2.

Figure 15:
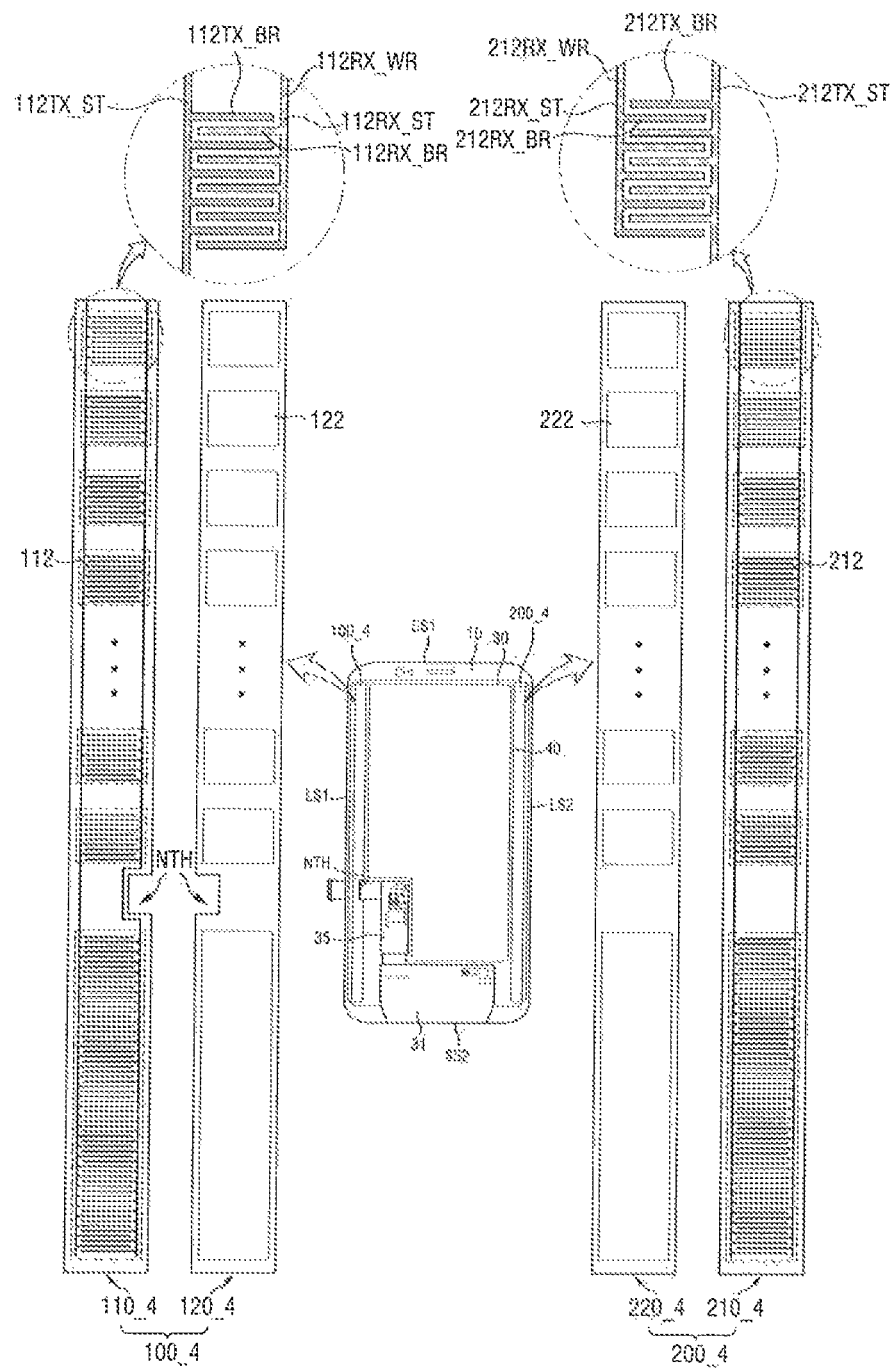
FIG. 15 is a layout view of a first force sensor and a second force sensor according to an exemplary embodiment of the inventive concept.

The first stem electrode 112TX_ST of the first force sensor 100 may be disposed adjacent to the outer side of the first force sensor 100 which is opposite the inner side where the recess NTH is formed. However, embodiments of the present disclosure are not limited to this case, and the first stem electrode 112TX_ST of the first force sensor 100 may also be disposed on the inner side of the first force sensor 100 where the recess NTH is formed. In this case, the first stem electrode 112TX_ST of the first force sensor 100 may be bent several times along the shape of the recess NTH of the first force sensor 100 to bypass the recess NTH and then extend to the lower end of the first force sensor 100, as illustrated in FIG. 15.

The first stem electrode 212TX_ST of the second force sensor 200 may be disposed adjacent to an outer side of the second force sensor 200 as illustrated in the drawing. However, the first stem electrode 212TX_ST of the second force sensor 200 may also be disposed adjacent to an inner side of the second force sensor 200. Since the second force sensor 200 does not include the recess NTH, it may extend straight without being bent to bypass the recess NTH, on whichever side the second force sensor 200 is disposed.

The first branch electrodes 112TX_BR or 212TX_BR branch from the first stem electrode 112TX_ST or 212TX_ST and extend in the width direction. In an embodiment, the first branch electrodes 112TX_BR or 212TX_BR are disposed in the sensing regions SR1 and SR2 and are not disposed in the non-sensing region NSR. If a region where the recess NTH is formed in the first force sensor 100 is the non-sensing region NSR, the first branch electrodes 112TX_BR are not disposed in the region. In the second force sensor 200 structured symmetrically to the first force sensor 100, the first branch electrodes 212TX_BR are not disposed in a region corresponding to the recess NTH.

In one sensing region SR1 or SR2, neighboring first branch electrodes 112TX_BR or 212TX_BR may be spaced apart from each other by a predetermined distance, and a second branch electrode 112RX_BR or 212RX_BR of the second electrode 112RX or 212RX may be disposed in each space between the neighboring first branch electrodes 112TX_BR or 212TX_BR. The number of the first branch electrodes 112TX_BR or 212TX_BR disposed in one sensing region SR1 or SR2 may vary depending on the area of the sensing region SR1 or SR2, but may be about 2 to 20 based on one first sensing region SR1. In an embodiment, the first branch electrodes 112TX_BR or 212TX_BR disposed in the second sensing region SR2 have the same width and spacing as the first branch electrodes 112TX_BR or 212TX_BR disposed in each first sensing region SR1. However, the number of the first branch electrodes 112TX_BR or 212TX_BR disposed in the second sensing region SR2 may be greater in proportion to the area of the second sensing region SR2.

The second electrode 112RX or 212RX of each of the first and second force sensors 100 and 200 includes a plurality of second stem electrodes 112RX_ST or 212RX_ST extending in the longitudinal direction and a plurality of second branch electrodes 112RX_BR or 212RX_BR branching from each of the second stem electrodes 112RX_ST or 212RX_ST.

The second stem electrodes 112RX_ST or 212RX_ST face the first stem electrode 112TX_ST or 212TX_ST. When the first stem electrode 112TX_ST or 212TX_ST is disposed adjacent to the inner side of each of the force sensors 100 and 200, the second stem electrodes 112RX_ST or 212RX_ST may be disposed adjacent to the outer side of each of the force sensors 100 and 200. Unlike the first stem electrode 112TX_ST or 212TX_ST, one second stem electrode 112RX_ST or 212RX_ST covers one sensing region SR1 or SR2. A separate second stem electrode 112RX_ST or 212RX_ST is disposed in each of the sensing regions SR1 and SR2, and second stem electrodes 112RX_ST or 212RX_ST disposed in different sensing regions SR1 and SR2 are electrically insulated from each other. Here, each second stem electrode 112RX_ST or 212RX_ST is connected to an independent sensing wiring 112RX_WR or 212RX_WR. Although not specifically illustrated for the sake of convenience, each sensing wiring 112RX_WR or 212RX_WR may extend in one direction and may be connected to a controller or a reading circuit (not illustrated). Accordingly, each sensing wiring 112RX_WR or 212RX_WR may transmit data about the voltage or the amount of current applied to a corresponding second electrode 112RX or 212RX to the controller or the reading circuit (not illustrated).

The second branch electrodes 112RX_BR or 212RX_BR branch from each of the second stem electrodes 112RX_ST or 212RX_ST and extend in the width direction. The extending direction of the second branch electrodes 112RX_BR or 212RX_BR and the extending direction of the first branch electrodes 12TX_BR or 212TX_BR are opposite to each other. The second branch electrodes 112RX_BR or 212RX_BR are disposed between the first branch electrodes 112TX_BR or 212TX_BR. The number of the first branch electrodes 112TX_BR or 212TX_BR and the number of the second branch electrodes 112RX_BR or 212RX_BR in one sensing region SR1 or SR2 may be, but are not limited to, equal.

In one sensing region SR1 or SR2, the first branch electrodes 112TX_BR or 212TX_BR and the second branch electrodes 112RX_BR or 212RX_BR may be alternately arranged. A gap between neighboring first and second branch electrodes 112TX_BR and 112RX_BR or 212TX_BR and 212RX_BR in one sensing region SR1 or SR2 may be, but is not limited to, uniform. A gap between nearest branch electrodes 112TX_BR and 112RX_BR or 212TX_BR and 212RX_BR of different sensing regions SR1 and SR2, which neighbor each other with the non-sensing region NSR interposed between them, may be greater than the gap between the branch electrodes 112TX_BR and 112RX_BR or 212TX_BR and 212RX_BR in one sensing region SR1 or SR2.

The second electrodes 112RX and 212RX are not disposed in the recess NTH of the first force sensor 100 and in a region of the second force sensor 200 which corresponds to the recess NTH. In some cases, however, the sensing wirings 112RX_WR and 212RX_WR of the second electrodes 112RX and 212RX may pass through the above regions. For example, the sensing wirings 112RX_WR and 212RX_WR of the second electrodes 112RX and 212RX may pass through a region of the recess NTH or the region of the second force sensor 200 which corresponds to the recess NTH.

The force sensing layer 122 or 222 may have a shape corresponding to each of the sensing regions SR1 and SR2. The force sensing layer 122 or 222 covers each of the sensing regions SR1 and SR2. The first branch electrodes 112TX_BR or 212TX_BR and the second branch electrodes 112RX_BR or 212RX_BR in each of the sensing regions SR1 and SR2 may overlap the force sensing layer 122 or 222 in the thickness direction.

The force sensors 100 and 200 described above can be used as input devices of various electronic devices including the display device 1, such as a Smartphone and a tablet PC. The force sensors 100 and 200 can be used in place of physical input buttons or in combination with the physical input buttons.

Figure 10A:
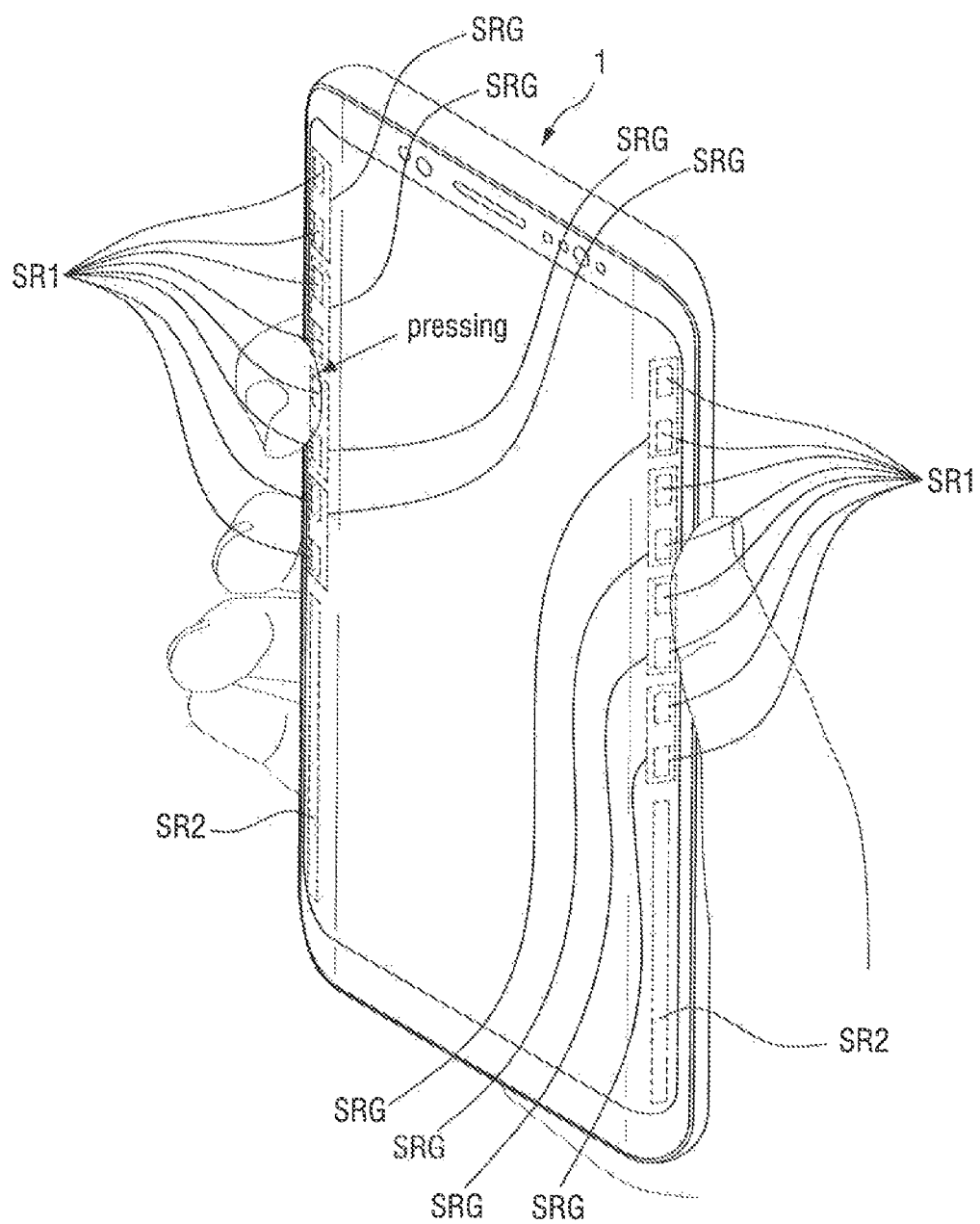
FIGS. 10A through 10C are mimetic diagrams illustrating a method of transmitting a force signal to the display device according to the embodiment.
Figure 10B:
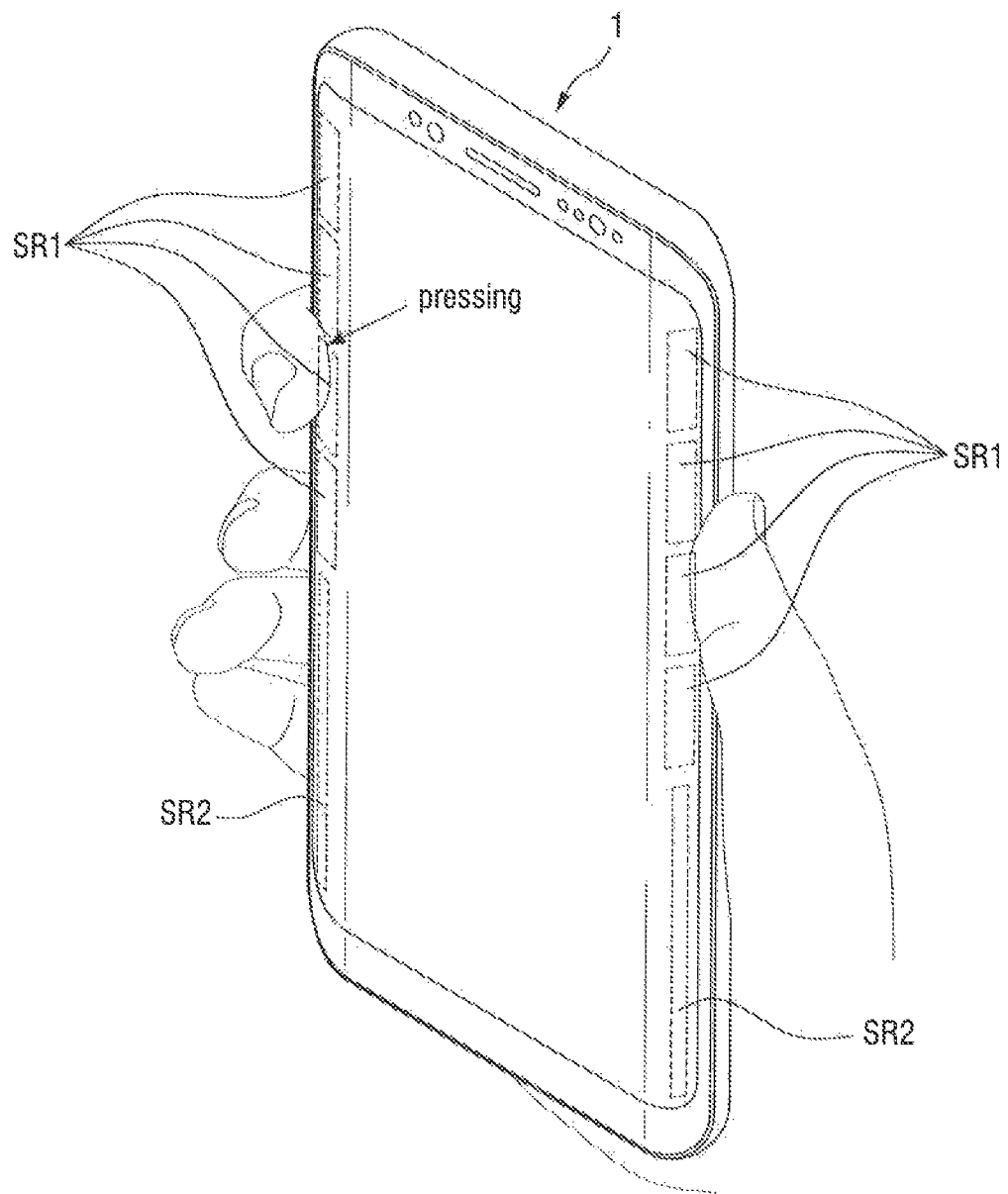
Figure 10C:
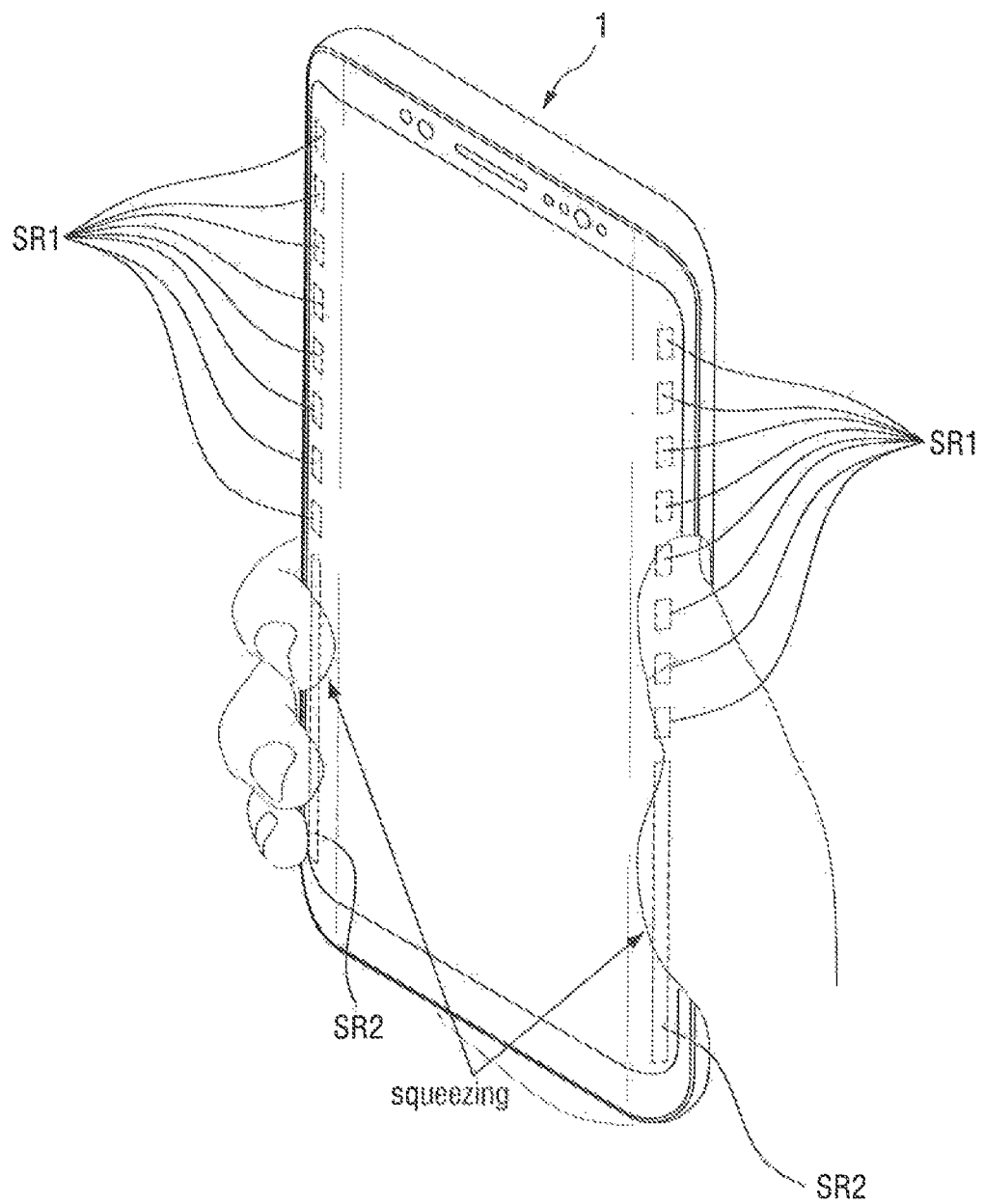

FIGS. 10A through 10C are mimetic diagrams illustrating a method of transmitting a force signal to the display device 1 according to the embodiment.

In FIGS. 10A through 10C, the display device 1 applied as a Smartphone is illustrated. In the display device 1 of FIGS. 10A through 10C, the force sensors 100 and 200 are disposed on the long sides in place of physical input buttons. In an exemplary embodiment, physical input buttons of the display device 1 are all omitted, and the force sensors 100 and 200 replace all of the physical input buttons.

In FIGS. 10A and 10B, a case where the first sensing regions SR1 are used as pressing recognition regions is illustrated. That is, in FIGS. 10A and 10B, a user is pressing a specific position with an index finger while gripping the display device 1 with fingers. At the specific position, a first sensing region SR1 of the force sensor 100 or 200 is disposed. When the first sensing region SR1 receives a force, the resistance of the force sensing layer 122 or 222 is changed, and the change in the resistance of the force sensing layer 122 or 222 may be sensed through the second electrode 112RX or 212RX to identify whether the force has been applied to the specific position as well as the magnitude of the force. Then, a preprogrammed operation of the display device 1 may be executed according to the force and/or the magnitude of the force applied to the specific position. For example, a preprogrammed function such as screen adjustment, screen lock, screen conversion, application calling, application execution, picture taking, or phone call reception may be performed.

In an embodiment, different operations are preprogrammed for different first sensing regions SR1. Therefore, as the number of the first sensing regions SR1 increases, the display device 1 can produce more outputs.

When a specific position on the display device 1 is pressed with a finger, a contact area between the finger and the display device 1 may be wider than the area of one first sensing region SR1. In other words, in some embodiments, the area of each first sensing region SR1 is set to be smaller than the contact area between the finger and the display device 1. In this case, when a specific position on the display device 1 is pressed with a finger, the force may be recognized by two or more first sensing regions SR1. In this case, as illustrated in FIG. 10A, a plurality of first sensing regions SR1 neighboring each other may form one sensing region group SRG, and the display device 1 may be programmed to execute a different operation in response to an input that occurs in each sensing region group SRG. Although two neighboring first sensing regions SR1 form one sensing region group SRG in FIG. 10A, this is only an example, and the number of the first sensing regions SRG included in each sensing region group SR1 can be variously changed to three or more. In an embodiment, a particular function associated with a sensing region group SRG is executed when one or more of the sensing regions SR1 of the sensing region group SRG are pressed. In an embodiment, the function is executed only when all of the sensing regions SR1 of the sensing region group SRG are pressed at the same time. In an embodiment, the function is executed only when all of the sensing regions SR1 of the sensing region group SRG are pressed at times that are within a certain time range of one another. For example, if the sensing region group SRG includes two sensing regions SR1, the first sensing region is pressed at time 0, and the time range is 50 ms, then the function would only be executed if the second sensing region is pressed within 50 ms.

Alternatively, if each first sensing region SR1 is formed to have a relatively wide area as illustrated in FIG. 10B, when a specific position on the display device 1 is pressed with a finger, the force may be recognized by one sensing region SR1. For example, the area of each first sensing region SR1 may be set to be substantially equal to or greater than a contact area between a finger and the display device 1 when pressing occurs. In this case, neighboring first sensing regions SR1 do not form a sensing region group, and the display device 1 is programmed to execute a different operation in response to an input that occurs in each first sensing region SR1. However, embodiments of the present disclosure are not limited to the above description. For example, first sensing regions SR1 not neighboring each other, for example, a first sensing region SR1 located on the left side of the display device 1 and a first sensing region SR1 located on the right side of the display device 1 can be programmed to execute the same operation.

The area of each first sensing region SR1 may also be set differently depending on position. For example, in a case where there are two first sensing regions SR1, a first sensing region SR1 relatively adjacent to an upper end of the display device 1 and a first sensing region SR1 relatively adjacent to a second sensing region SR2 may be set to have different areas.

In FIG. 10C, a case where the second sensing regions SR2 are used as squeezing recognition regions is illustrated. That is, in FIG. 10C, a user is squeezing a relatively large area using the palm and fingers while gripping the display device 1 with the fingers. The second sensing regions SR2 are disposed in the area where the squeezing is performed to sense whether a force has been applied by the squeezing as well as the magnitude of the force. Thus, a preprogrammed operation of the display device 1 may be performed according to the sensing result.

The user may perform the squeezing operation by naturally applying force to the entire hand while gripping the display device 1. Since the user can quickly perform the squeezing operation without elaborate movement of the hand while gripping the display device 1, a simpler and quicker input is possible. Therefore, the second sensing regions SR2 can be used as an input medium for a frequently used function or a program requiring speed such as snapshot shooting. For example, the snapshot shooting may include an operation of opening a camera application and using the camera application to control a camera to take a photograph.

In an embodiment, the display device 1 performs a first operation when an input occurs in a first sensing region SR1 and performs a second operation different from the first operation when an input occurs in a second sensing region SR2. That is, in some embodiments, a preprogrammed operation of the display device 1 corresponding to the first sensing region SR1 and a preprogrammed operation of the display device 1 corresponding to the second sensing region SR2 are different from each other.

Figure 11A:
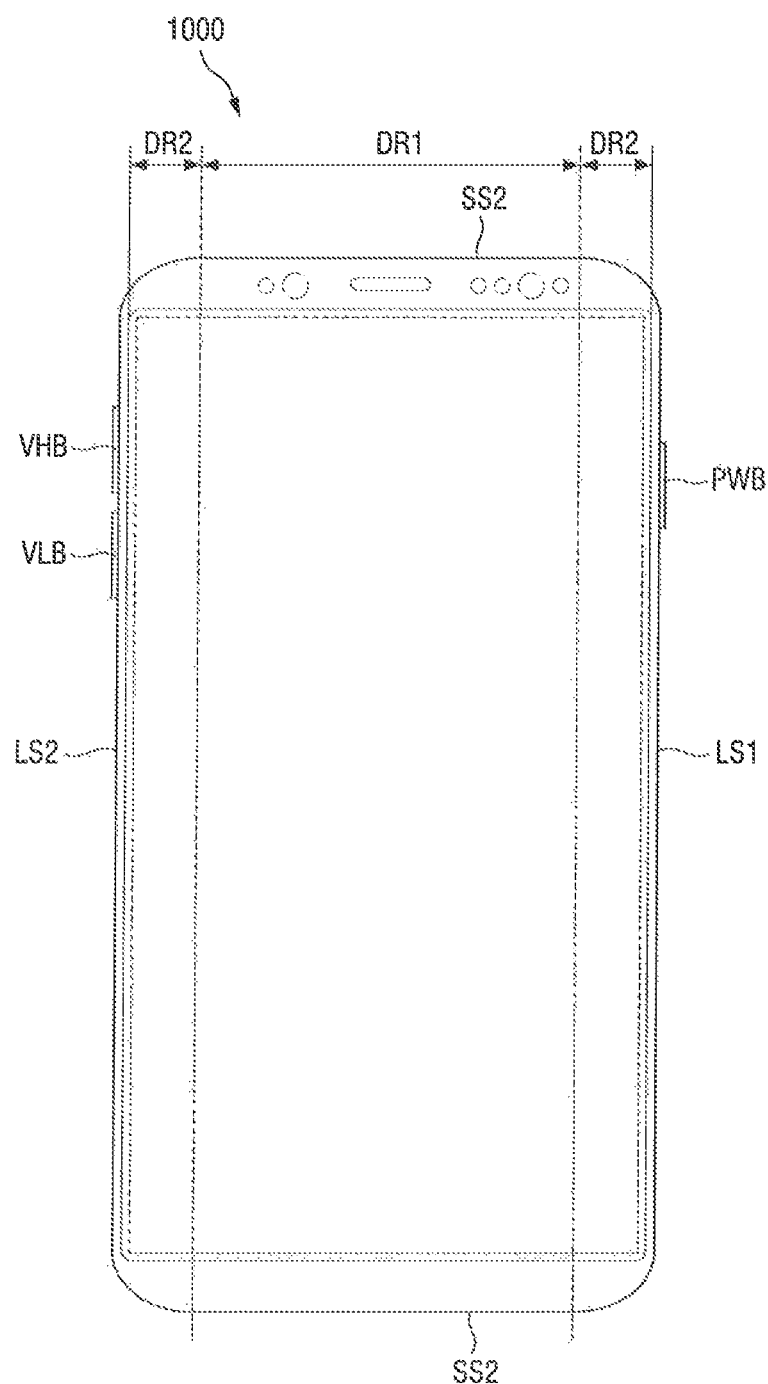
FIGS. 11A and 11B are plan views of display devices for explaining an example in which a first force sensor and a second force sensor replace physical input buttons.
Figure 11B:
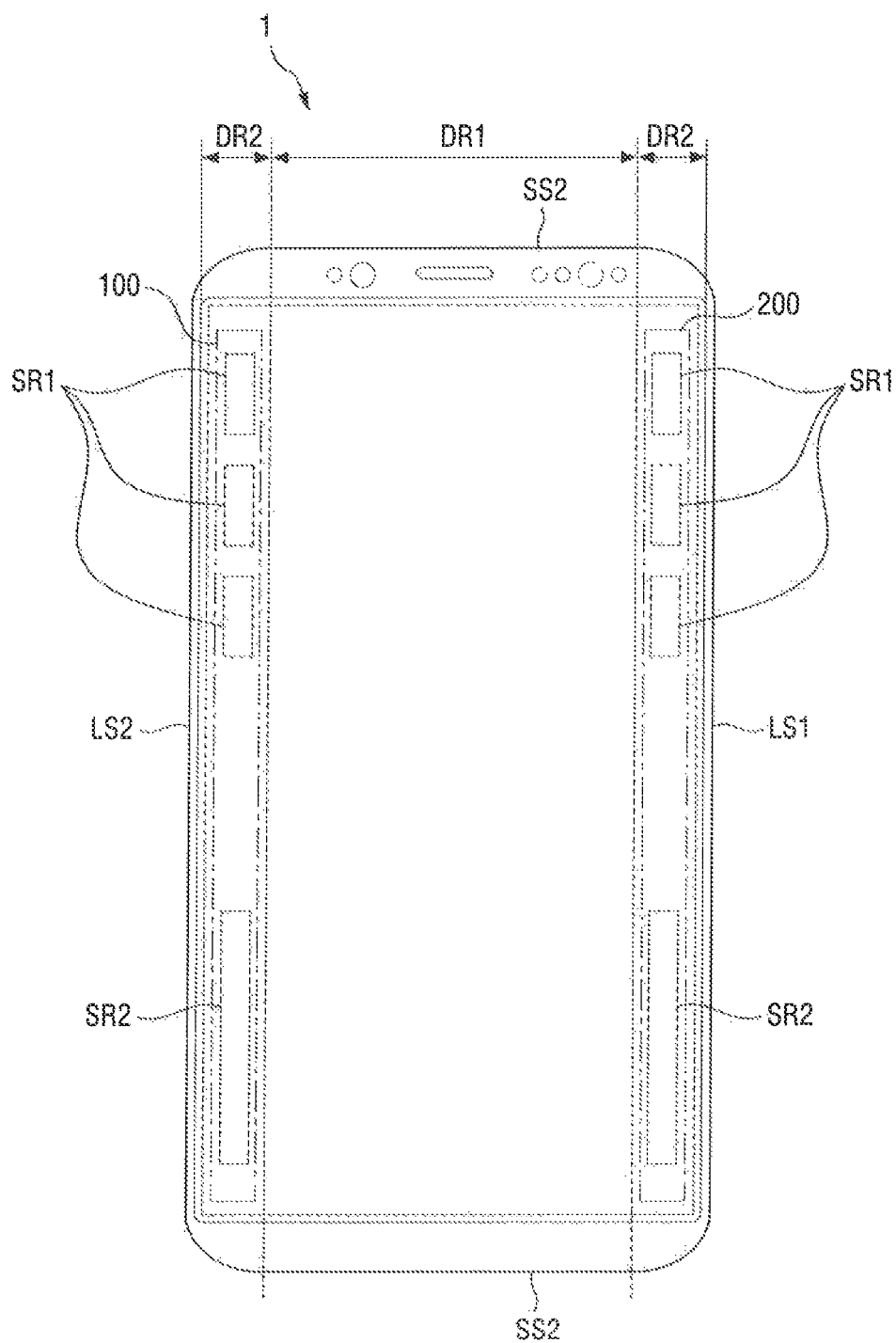

FIGS. 11A and 11B are plan views of display devices for explaining an example in which a first force sensor and a second force sensor replace physical input buttons. FIG. 11A is a plan view of a display device 1000 including general physical input buttons, and FIG. 11B is a plan view of a display device 1 including a first force sensor 100 and a second force sensor 200.

Referring to FIG. 11A, the display device 1000 including the physical input buttons includes, on a second long side LS2 (left side), a volume up button VHB and a volume down button VLB for adjusting the volume of sound output from the display device 1000. In the drawing, the volume up button VHB and the volume down button VLB are physically separated from each other. In some cases, however, the volume up button VHB and the volume down button VLB may be integrated.

The display device 1000 including the physical input buttons further includes, on a first long side LS1 (right side), a power button PWB for turning on/off the display device 1000 or switching the display device 1000 to a sleep mode.

Further, the display device 1000 including the physical input buttons may further include, on the long side LS2, an input button programmed to perform a preset function.

The display device 1000 may also include various physical input buttons other than the above buttons.

Referring to FIG. 11B, in an embodiment, the first force sensor 100 of the display device 1 is disposed on the second long side LS2 of the display device 1, and first sensing regions SR1 of the first force sensor 100 are located at substantially the same or similar positions as the volume up button VHB, the volume down button VLB, and the input button illustrated in FIG. 11A to replace the volume up button VHB, the volume down button VLB, and the input button.

The second force sensor 200 of the display device 1 is disposed on the first long side LS1 of the display device 1, and any one or two or more of first sensing regions SR1 of the second force sensor 200 are disposed at substantially the same or similar positions as the power button PWB illustrated in FIG. 11A to replace the power button PWB.

That is, in some embodiments, physical input buttons may all be omitted from the display device 1 and replaced by force sensors. In this case, since input devices for receiving user input are not exposed on the surface of the display device 1, the degree of freedom in design can be increased, and the aesthetic appearance can be enhanced.

In addition, the first force sensor 100 and the second force sensor 200 may be located on both long sides LS1 and LS2 of the display device 1 where the fingers of a user holding the display device 1 are naturally positioned. Therefore, the user's convenience of operating the display device 1 can be increased.

Hereinafter, other embodiments will be described. In the following embodiments, the same components as those described above will be indicated by the same reference numerals, and a redundant description of the components will be omitted or described briefly. The following embodiments will be described, focusing mainly on differences with the previous embodiment.

Figure 12:
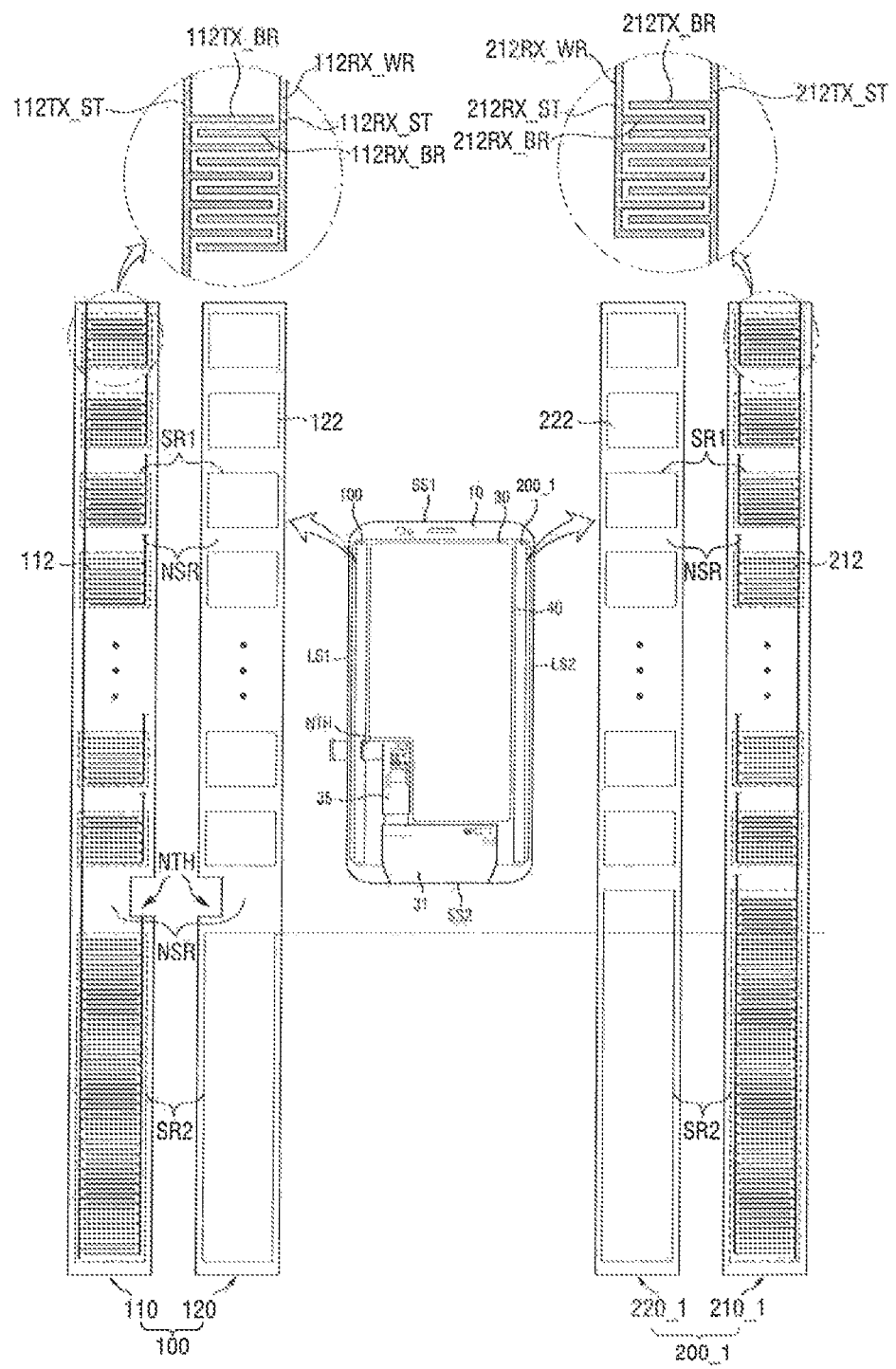
FIG. 12 is a layout view of a first force sensor and a second force sensor according to an exemplary embodiment of the inventive concept.

FIG. 12 is a layout view of a first force sensor 100 and a second force sensor 200_1 according to an exemplary embodiment of the inventive concept.

The embodiment of FIG. 12 is different from the embodiment of FIG. 9 in that a second sensing region SR2 of the second force sensor 200_1 has a larger area than a second sensing region SR2 of the first force sensor 100. Referring to FIG. 12, the second sensing region SR2 of the second force sensor 200_1 extends further toward an upper end than the second sensing region SR2 of the first force sensor 100. The second sensing region SR2 of the second force sensor 200_1 may extend up to a region corresponding to a recess NTH of the first force sensor 100.

In the squeezing operation of FIG. 10C, the areas where the palm or the fingers naturally touch the first long side and the second long side may be different. The embodiment of FIG. 12 enables more precise force measurement in this case.

In FIG. 12, reference numeral '210_1' indicates a first substrate of the second force sensor 200_1, and reference numeral '220_1' indicates a second substrate of the second force sensor 200_1.

Figure 13:
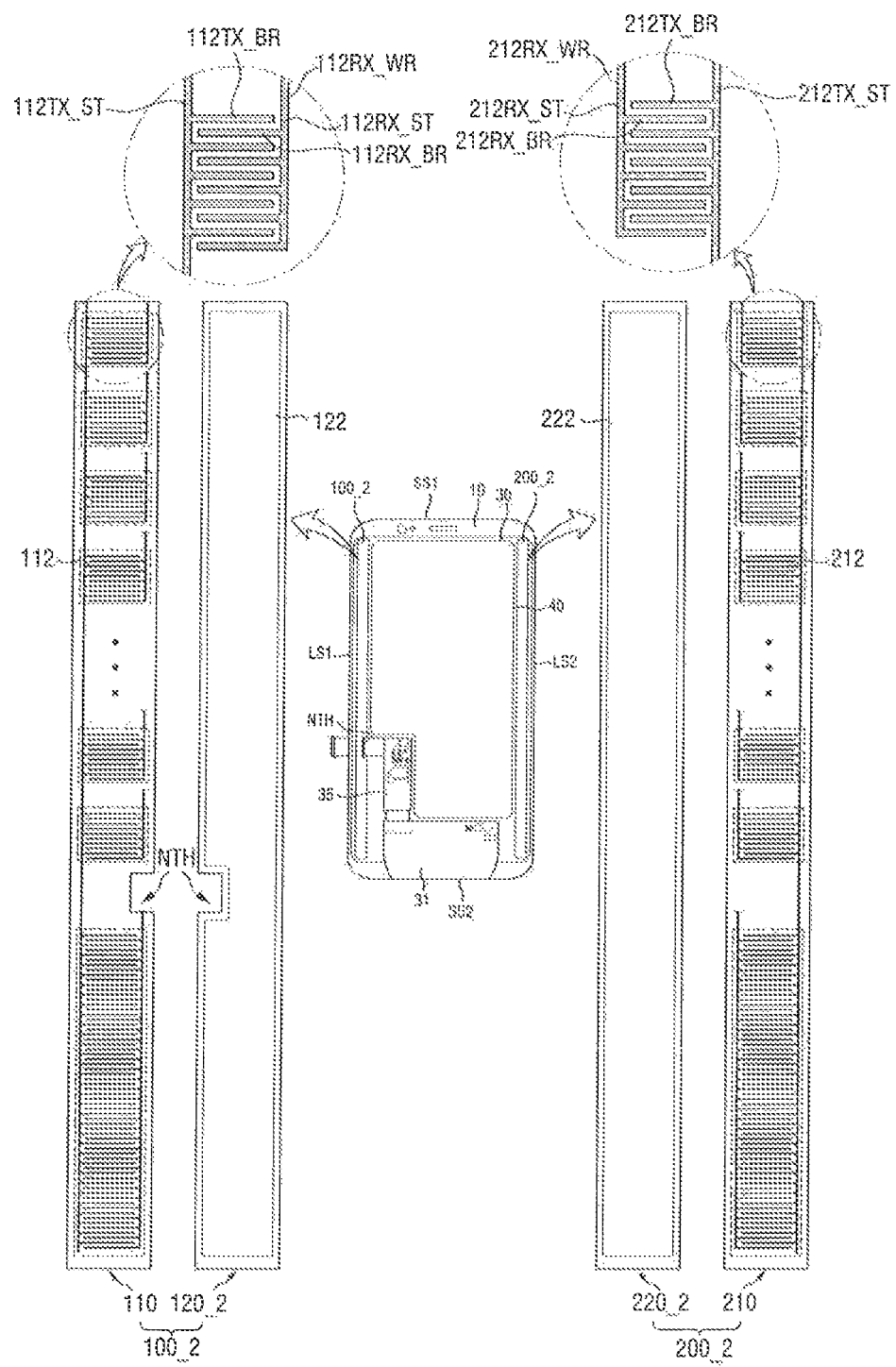
FIG. 13 is a layout view of a first force sensor and a second force sensor according to an exemplary embodiment of the inventive concept.

FIG. 13 is a layout view of a first force sensor 100_2 and a second force sensor 200_2 according to an exemplary embodiment of the inventive concept.

FIG. 13 shows that a force sensing layer 122 or 222 can be formed as a single piece without being divided into segments respectively corresponding to sensing regions SR1 and SR2. Referring to FIG. 13, a second substrate 120_2 or 220_2 of each of the first force sensor 100_2 and the second force sensor 200_2 includes the force sensing layer 122 or 222 formed as a single piece. Although the force sensing layer 122 or 222 is formed as a single piece, a second electrode 112RX or 212RX and a first electrode 112TX or 212TX is still a functionally separate electrode disposed in each of the sensing regions SR1 and SR2. Therefore, when a force is applied to a specific sensing region SR1 or SR2, the transmission of a sensing signal to the second electrodes 112RX or 212RX of other sensing regions SR1 and SR2 can be prevented, thereby preventing the generation of noise at an input position.

Figure 14:
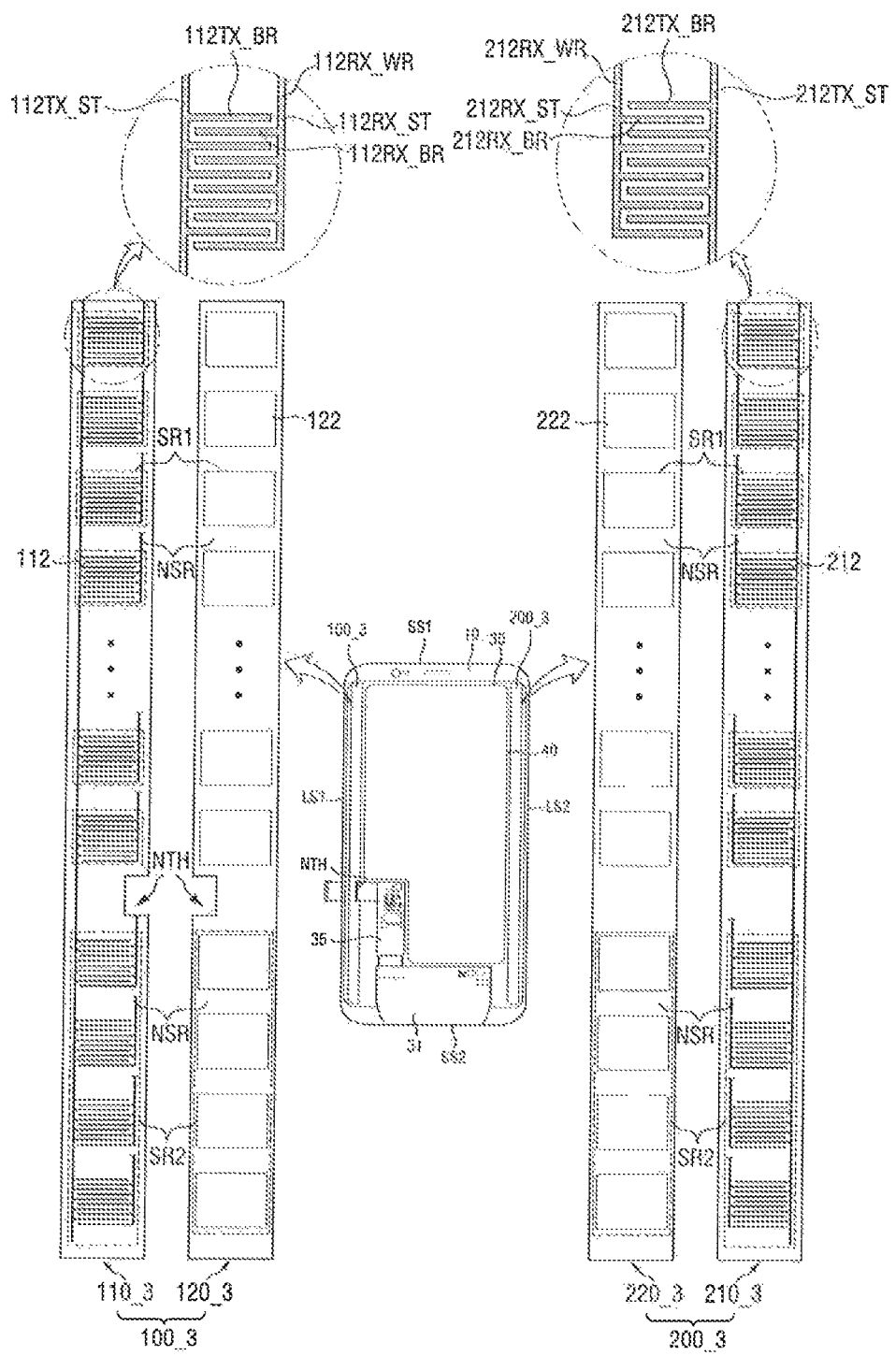
FIG. 14 is a layout view of a first force sensor and a second force sensor according to an exemplary embodiment of the inventive concept.

FIG. 14 is a layout view of a first force sensor 100_3 and a second force sensor 200_3 according to an exemplary embodiment of the inventive concept. The embodiment of FIG. 14 shows that a non-sensing region NSR can be disposed in portions of a second sensing region SR2 of each of the first force sensor 100_3 and the second force sensor 200_3.

Referring to FIG. 14, in the second sensing region SR2 of each of the first and second force sensors 100_3 and 200_3, first branch electrodes 112TX_BR or 212TX_BR and second branch electrodes 112RX_BR or 212RX_BR of a first substrate 110_3 or 210_3 may be arranged similarly to a plurality of first sensing regions SR1. That is, the first branch electrodes 112TX_BR or 212TX_BR and the second branch electrodes 112RX_BR or 212RX_BR are alternately arranged in predetermined numbers at a first interval in the longitudinal direction, are not arranged by a second interval larger than the first interval, and then are alternately arranged again at the first interval. Even in this case, the second branch electrodes 112RX_BR or 212RX_BR in the second sensing region SR2 are electrically connected by one second stem electrode 112RX_ST or 212RX_ST. A force sensing layer 122 or 222 of a second substrate 120_3 or 220_3 may also be patterned like the first sensing regions SR1. However, embodiments of the present disclosure are not limited to this case, and the force sensing layer 122 or 222 in the second sensing region SR2 may also be formed as a single piece as illustrated in FIG. 9 without being patterned.

In the current embodiment, the first and second electrodes 112TX and 112RX or 212TX and 212RX and the force sensing layer 122 or 222 have similar patterns not only in the first sensing regions SR1 but also in the second sensing region SR2. Therefore, problems that may occur due to a difference in shape can be prevented. Although the non-sensing region NSR is disposed in portions of the second sensing region SR2, since the entire second sensing region SR2 is sensed using one second electrode 112RX or 212RX as in the embodiment of FIG. 9 and a squeezing operation is performed on a wide surface, a squeezing input can be recognized more easily.

FIG. 15 is a layout view of a first force sensor 100_4 and a second force sensor 200_4 according to an exemplary embodiment of the inventive concept. The embodiment of FIG. 15 is different from the embodiment of FIG. 9 in that the structure of a first substrate 110_4 of the first force sensor 100_4 is different from that of a first substrate 210_4 of the second force sensor 200_4. More specifically, a second electrode 112RX or 212RX of each of the first force sensor 100_4 and the second force sensor 200_4 is formed as a single piece.

Referring to FIG. 15, in the current embodiment, all portions of the second electrode 112RX or 212RX are connected by a second stem electrode 112RX_ST or 212RX_ST, like a first electrode 112TX or 212TX. Therefore, when a force is applied, it is possible to measure the presence or absence of the force and the magnitude of the force, but it may be difficult to identify a position where the force has been applied.

The position where the force has been applied may be identified through the touch member 20 (see FIG. 2). That is, a touch electrode may be disposed in regions of the touch member 20 which overlap the force sensors 100_4 and 200_4 to detect the presence or absence of a touch and the position of the touch, and the presence or absence of a force and the magnitude of the force may be measured by the force sensors 100_4 and 200_4 and used as an input signal.

The structure of a second substrate 120_4 of the first force sensor 100_4 and the structure of a second substrate 220_4 of the second force sensor 200_4 may be substantially the same as those of the second substrates 120 and 220 illustrated in FIG. 9, respectively.

Figure 16:
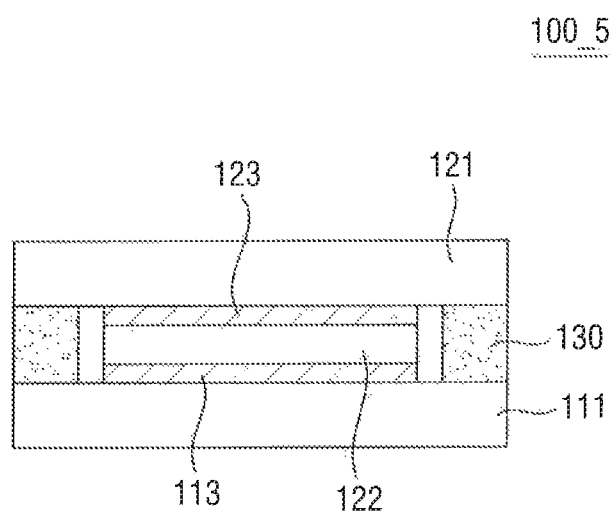
FIG. 16 is a cross-sectional view of a first force sensor according to an exemplary embodiment of the inventive concept.
Figure 17:
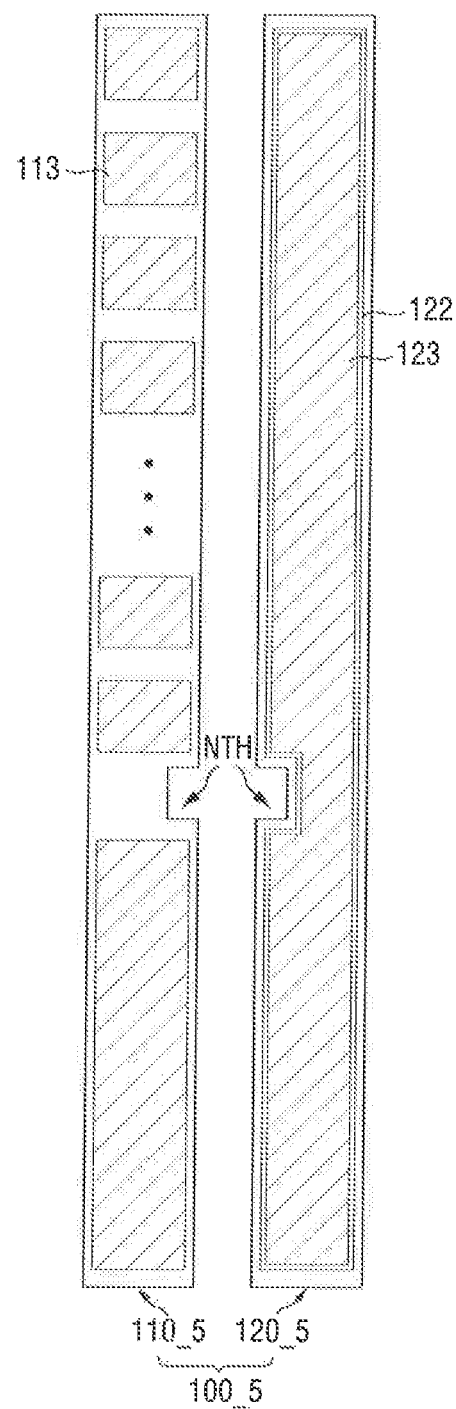
FIG. 17 is a layout view of the first force sensor of FIG. 16.

FIG. 16 is a cross-sectional view of a first force sensor 100_5 according to an exemplary embodiment of the inventive concept. FIG. 17 is a layout view of the first force sensor 100_5 of FIG. 16. Referring to FIGS. 16 and 17, the shape and arrangement of first and second electrodes 113 and 123 of the first force sensor 100_5 according to the current embodiment are different from those of the embodiment of FIG. 9.

Specifically, a first substrate 110_5 includes a first base 111 and the first electrode 113 disposed on the first base 111. A second substrate 120_5 includes a second base 121, the second electrode 123 disposed on the second base 121, and a force sensing layer 122 disposed on the second electrode 123. The first electrode 113 faces the force sensing layer 122 and is in contact with or adjacent to the force sensing layer 122.

In the current embodiment, the first electrode 113 and the second electrode 123 face each other in the thickness direction with the force sensing layer 122 interposed between them. When a force is applied, the resistance of the force sensing layer 122 is changed, thereby changing the amount of current flowing between the first electrode 113 and the second electrode 123. Thus, the force input can be sensed.

In FIG. 17, the first electrode 113 is a separate sensing electrode disposed in each sensing region, and the second electrode 123 is a driving electrode formed as a whole-plate electrode. However, the first electrode 113 may also be formed as a whole-plate electrode, and the second electrode 123 may also be formed as a sensing electrode.

Figure 18:
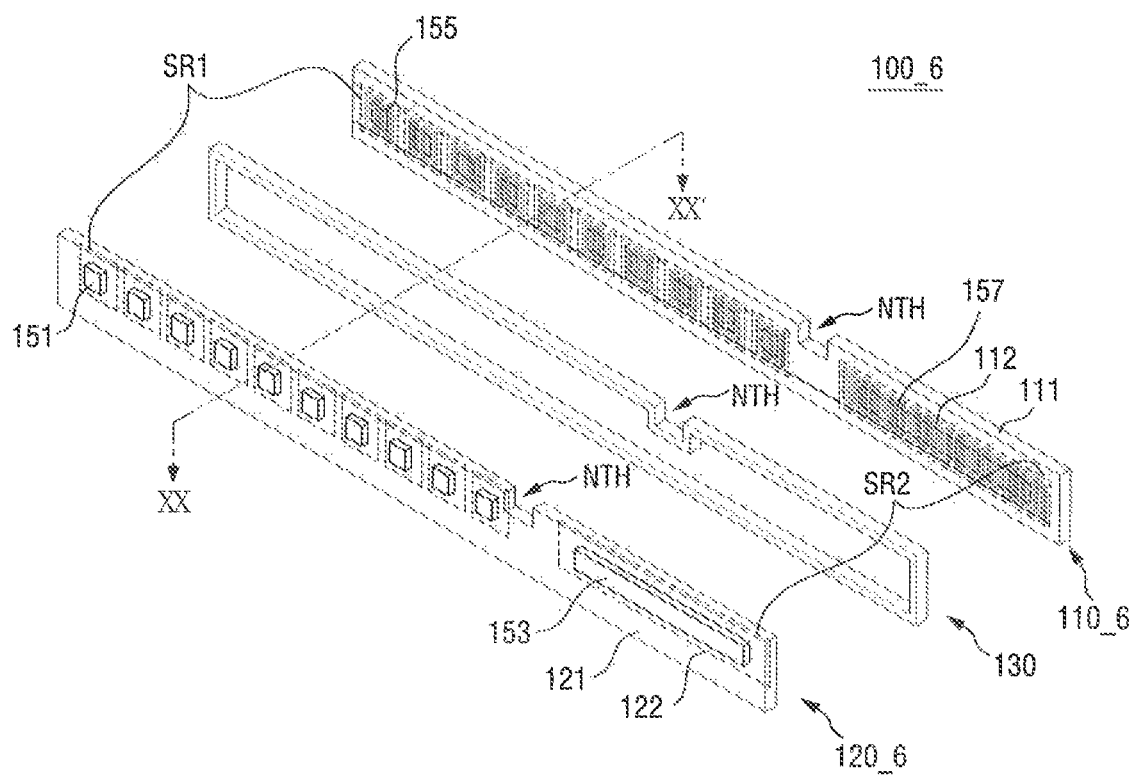
FIG. 18 is an exploded perspective view of a first force sensor according to an exemplary embodiment of the inventive concept.
Figure 19:
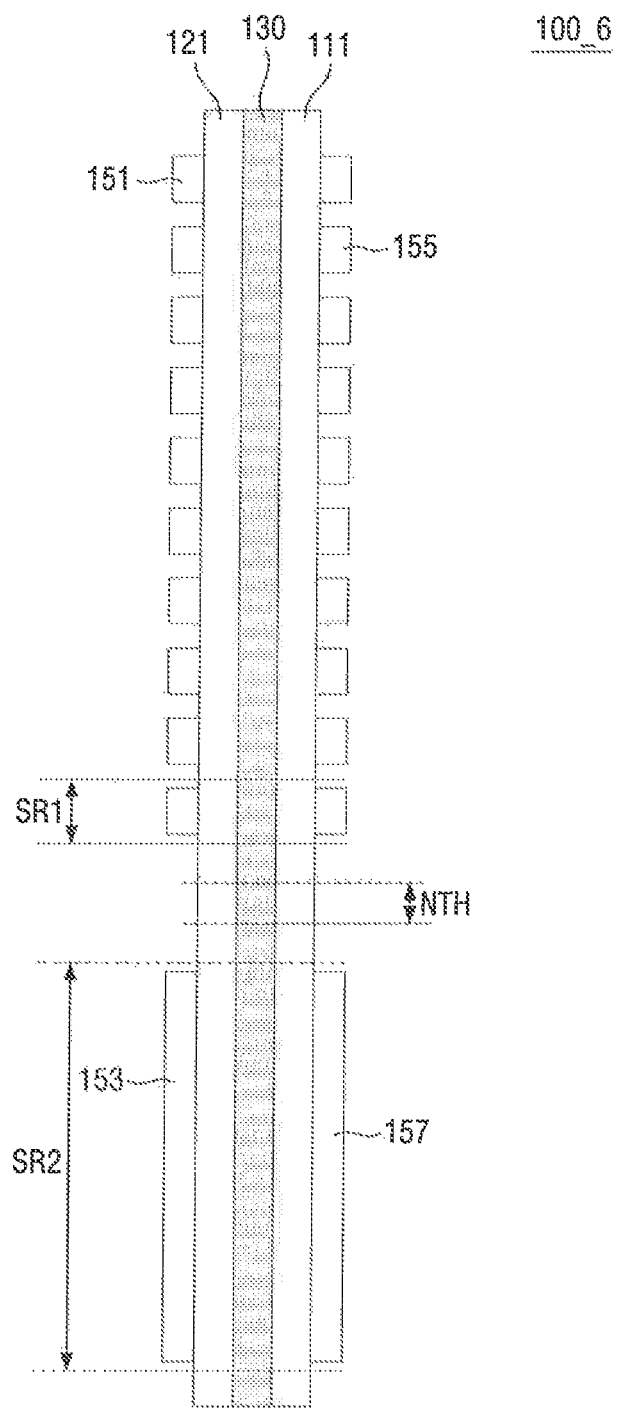
FIG. 19 illustrates the first force sensor of FIG. 18 as viewed from above.
Figure 20:
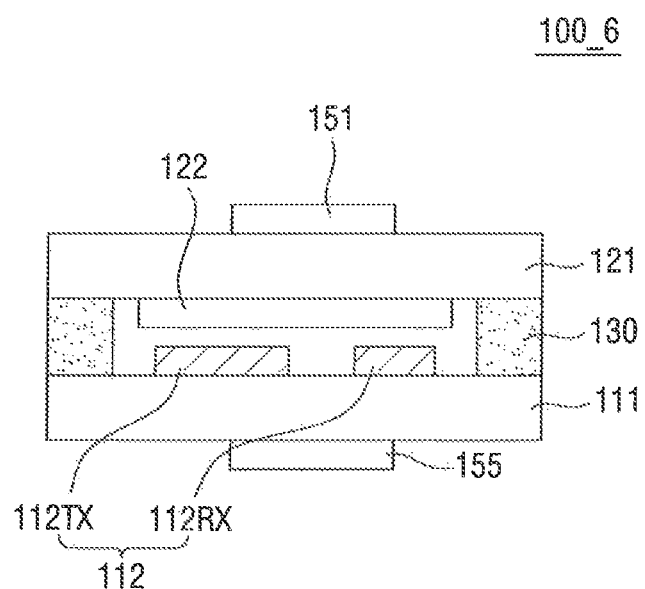
FIG. 20 is a cross-sectional view taken along line XX-XX' of FIG. 18.

FIG. 18 is an exploded perspective view of a first force sensor 100_6 according to an exemplary embodiment of the inventive concept. FIG. 19 illustrates the first force sensor 100_6 of FIG. 18 as viewed from above. More specifically, FIG. 19 illustrates the first force sensor 100_6 in a state where a first substrate 110_6 and a second substrate 120_6 are bonded together as viewed from above based on FIG. 18. FIG. 20 is a cross-sectional view taken along line XX-XX' of FIG. 18. In FIGS. 18 through 20, the structure and operation of a force sensor will be described using the first force sensor 100_6 as an example. However, a second force sensor has substantially the same structure as the first force sensor 100_6 except for a recess NTH.

Referring to FIGS. 18 through 20, the first force sensor 100_6 according to the current embodiment is different from the embodiment of FIGS. 6 and 7 in that it further includes force concentration bumps 151, 153, 155 and 157.

Specifically, the second substrate 120_6 includes a second base 121 and a force sensing layer 122 disposed on a surface of the second base 121 which faces the first substrate 110_6 and further includes first force concentration bumps 151 and a second force concentration bump 153 disposed on the other surface of the second base 121. The other surface of the second base 121 is a surface opposite to the surface of the second base 121 on which the force sensing layer 122 is disposed.

In addition, the first substrate 110_6 includes a first base 111 and an electrode layer 112 disposed on a surface of the first base 111 which faces the second substrate 120_6 and further includes third force concentration bumps 155 and a fourth force concentration bump 157 disposed on the other surface of the first base 111. The other surface of the first base 111 is a surface opposite to the surface of the first base 111 on which the electrode layer 112 is disposed.

The electrode layer 112 includes a first electrode 112TX which is a driving electrode and a second electrode 112RX which is a sensing electrode as described above.

The first force concentration bumps 151 and the third force concentration bumps 155 may be arranged to overlap the first sensing regions SR1. For example, each first sensing region SR1 may include one of the first force concentration bumps 151 and one of the third force concentration bumps 155. In some embodiments, when a plurality of first sensing regions SR1 are arranged, a plurality of first force concentration bumps 151 are arranged to overlap the first sensing regions SR1, respectively.

Since the first force concentration bumps 151 and the third force concentration bumps 155 overlap the first sensing regions SR1, they may also overlap each other. In addition, in each of the first sensing regions SR1, the force sensing layer 122 may overlap the first electrode 112TX, the second electrode 112RX, the first force concentration bump 151 and the third force concentration bump 155.

In an embodiment, the area of each of the first force concentration bumps 151 and the third force concentration bumps 155 is smaller than the area of each of the first sensing regions SR1. In some embodiments, the area of each of the first force concentration bumps 151 is 25 mm$^2$ or less.

In an embodiment, the second force concentration bump 153 and the fourth force concentration bump 157 are arranged to overlap a second sensing region SR2. For example, a second sensing region SR2 may include the second force concentration bump 153 and the fourth force concentration bump 157. The second force concentration bump 153 and the fourth force concentration bump 157 may also overlap each other. In some embodiments, the length (width in the extending direction of the force sensor) of the second force concentration bump 153 is greater than the length of one first force concentration bump 151, and the length (width in the extending direction of the force sensor) of the fourth force concentration bump 157 is greater than the length of one third force concentration bump 155. In addition, in some embodiments, the length and area of the second force concentration bump 153 and the length and area of the fourth force concentration bump 157 is smaller than the length and area of the second sensing region SR2. Although only one second force concentration bump 153 and one fourth force concentration bump 157 are arranged to overlap the second sensing regions SR2 in the drawings, the present disclosure is not limited to this case. In an embodiment, each of the second force concentration bump 153 and the fourth force concentration bump 157 is provided in plural numbers.

Since the second force concentration bump 153 and the fourth force concentration bump 157 overlap the second sensing region SR2, the force sensing layer 122 may overlap the first electrode 112TX, the second electrode 112RX, the second force concentration bump 153, and the fourth force concentration bump 157 in the second sensing region SR2.

The first sensing regions SR1 may be arranged above the recess NTH, and the second sensing region SR2 may be disposed below the recess NTH. Therefore, the first force concentration bumps 151 and the third force concentration bumps 155 may be arranged above the recess NTH, and the second force concentration bump 153 and the fourth force concentration bump 157 may be disposed below the recess NTH. In some embodiments, the first force concentration bumps 151 are spaced apart from the second force concentration bump 153, and the third force concentration bumps 155 are spaced apart from the fourth force concentration bump 157.

In some embodiments, the first force concentration bumps 151 and the second force concentration bump 153 are bonded to the other surface of the second base 121. In some embodiments, the first force concentration bumps 151 and the second force concentration bump 153 are formed by performing a coating process directly on the other surface of the second base 121 or by performing a screen printing process. Alternatively, the first force concentration bumps 151 and the second force concentration bump 153 may be bonded to the other surface of the second base 121 by a bonding layer such as an adhesive or a double-sided tape.

In some embodiments, the third force concentration bumps 155 and the fourth force concentration bump 157 are bonded to the other surface of the first base 111. In some embodiments, the third force concentration bumps 155 and the fourth force concentration bump 157 are formed by performing a coating process directly on the other surface of the first base 111 or by performing a screen printing process. Alternatively, the third force concentration bumps 155 and the fourth force concentration bump 157 may be bonded to the other surface of the first base 111 by a bonding layer such as an adhesive or a double-sided tape.

The first force concentration bumps 151, the second force concentration bump 153, the third force concentration bumps 155 and the fourth force concentration bump 157 may protrude outward along the thickness direction of the first force sensor 100_6. A cross-section of each of the first force concentration bumps 151, the second force concentration bump 153, the third force concentration bumps 155, and the fourth force concentration bump 157 may have a quadrilateral shape in some embodiments, but may also have various shapes such as a hemispherical shape and a polygonal shape.

In an embodiment, the first force concentration bumps 151, the second force concentration bump 153, the third force concentration bumps 155 and the fourth force concentration bump 157 are made of a material that resists being deformed by physical force. In some embodiments, the first force concentration bumps 151, the second force concentration bump 153, the third force concentration bumps 155 and the fourth force concentration bump 157 are made of polymer resin such as epoxy resin or acrylic resin. Alternatively, the first force concentration bumps 151, the second force concentration bump 153, the third force concentration bumps 155 and the fourth force concentration bump 157 may be made of an insulating material having a high hardness. Alternatively, the first force concentration bumps 151, the second force concentration bump 153, the third force concentration bumps 155, and the fourth force concentration bump 157 may be made of metal.

In some embodiments, the first force concentration bumps 151 and the second force concentration bump 153 are made of the same material as the force sensing layer 122. In this case, after the force sensing layer 122 is formed on the surface of the second base 121, the second base 121 is turned upside down. Then, the first force concentration bumps 151 and the second force concentration bump 153 may be formed using the same process as the process for forming the force sensing layer 122. For example, if the force sensing layer 122 is formed by a photolithography process, the first force concentration bumps 151 and the second force concentration bump 153 may also be formed by the same photolithography process. Therefore, the manufacturing process can be simplified, and the possibility of misalignment of the first force concentration bumps 151 and the second force concentration bump 153 with the force sensing layer 122 can be reduced.

Also, in some embodiments, the third force concentration bumps 155 and the fourth force concentration bump 157 are made of the same material as the first and second electrodes 112TX and 112RX. In this case, after the first and second electrodes 112TX and 112RX are formed on the surface of the first base 111, the first base 111 is turned upside down. Then, the third force concentration bumps 155 and the fourth force concentration bump 157 may be formed using the same process as the process for forming the first and second electrodes 112TX and 112RX. For example, if the first and second electrodes 112TX and 112RX are formed by a screen printing method, the third force concentration bumps 155 and the fourth force concentration bump 157 may also be formed by the same screen printing method. Therefore, the manufacturing process can be simplified, and the possibility of misalignment of the third force concentration bumps 155 and the fourth force concentration bump 157 with the first and second electrodes 112TX and 112RX can be reduced.

However, embodiments of the present disclosure are not limited to the above example. In an embodiment, the first force concentration bumps 151 and the second force concentration bump 153 are made of the same material as the first and second electrodes 112TX and 112RX, and the third force concentration bumps 155 and the fourth force concentration bump 157 are made of the same material as the force sensing layer 122.

In some embodiments, the first force concentration bumps 151, the second force concentration bump 153, the third force concentration bumps 155, and the fourth force concentration bump 157 are formed to have a height of 5 μm or more in view of the pressing force concentration effect.

When a pressing force is applied in the thickness direction of the first force sensor 100_6, the first force concentration bumps 151 and the third force concentration bumps 155 can more reliably transmit the applied force to the force sensing layer 122 located in the first sensing regions SR1 without dispersing the applied force. In addition, the second force concentration bump 153 and the fourth force concentration bump 157 can more reliably transmit the applied force to the force sensing layer 122 located in the second sensing region SR2. Accordingly, a greater change in resistance value may be detected, resulting in the improvement of the sensitivity of the first force sensor 100_6.

FIGS. 21 through 28 are respectively cross-sectional views of modified examples of the force sensor 100_6 illustrated in FIG. 20.

Figure 21:
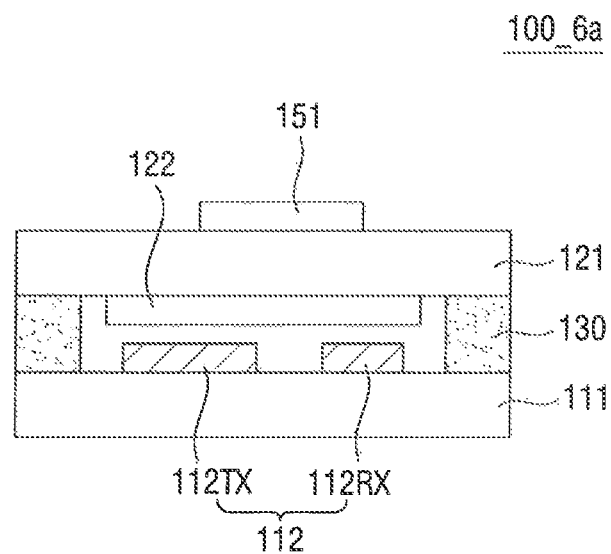
FIGS. 21 through 28 are respectively cross-sectional views of modified examples of the force sensor illustrated in FIG. 20.

Referring to FIG. 21, a first force sensor 100_6a according to the current embodiment is substantially the same as the embodiment of FIGS. 19 and 20 except that it does not include third force concentration bumps (155 in FIG. 19) and a fourth force concentration bump (157 in FIG. 19).

Figure 22:
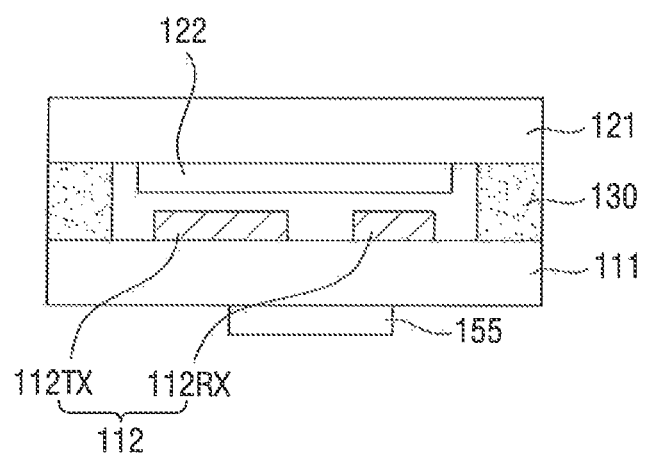

Referring to FIG. 22, a first force sensor 100_6b according to the current embodiment is substantially the same as the embodiment of FIGS. 19 and 20 except that it does not include first force concentration bumps (151 in FIG. 19) and a second force concentration bump (153 in FIG. 19).

Figure 23:
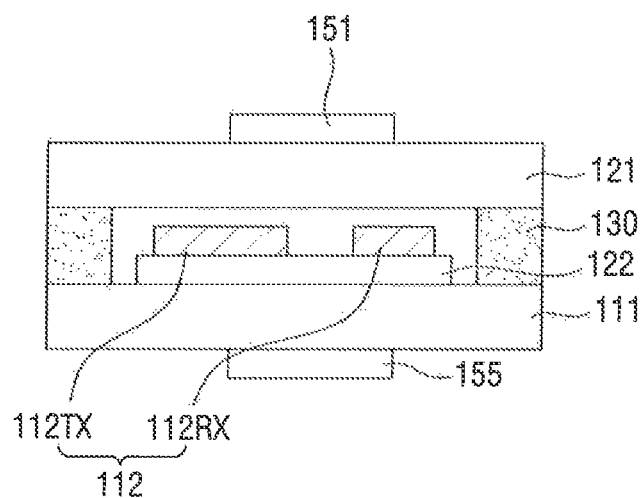

Referring to FIG. 23, a first force sensor 100_6c according to the current embodiment is substantially the same as the embodiment of FIGS. 19 and 20 except that a force sensing layer 122 is located on a surface of a first base 111 and a first electrode 112TX and a second electrode 112RX are located on the force sensing layer 122.

Figure 24:
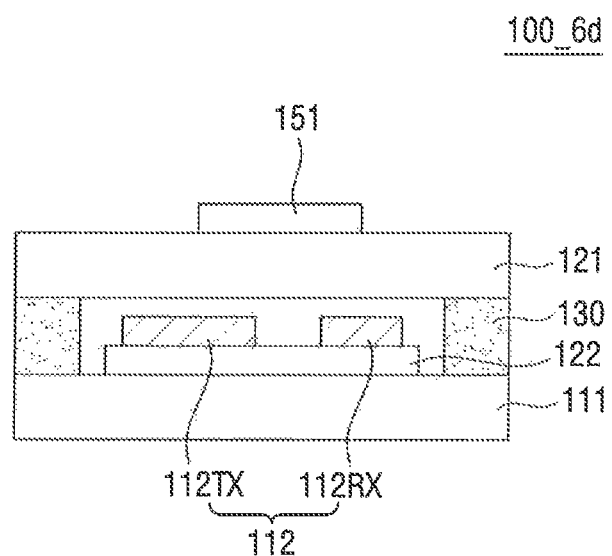

Referring to FIG. 24, a first force sensor 100_6d according to the current embodiment is substantially the same as the embodiment of FIGS. 19 and 20 except that a force sensing layer 122 is located on a surface of a first base 111, a first electrode 112TX and a second electrode 112RX are located on the force sensing layer 122, and third force concentration bumps (155 in FIG. 19) and a fourth force concentration bump (157 in FIG. 19) are not provided.

Figure 25:
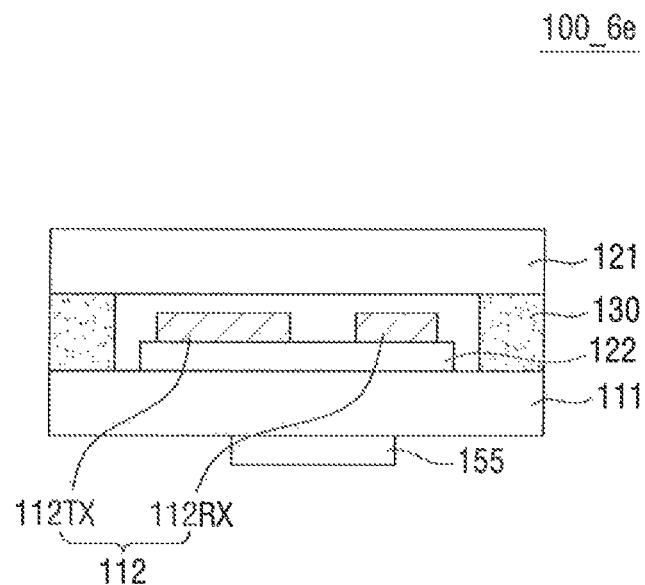

Referring to FIG. 25, a first force sensor 100_6e according to the current embodiment is substantially the same as the embodiment of FIGS. 19 and 20 except that a force sensing layer 122 is located on a surface of a first base 111, a first electrode 112TX and a second electrode 112RX are located on the force sensing layer 122, and first force concentration bumps (151 in FIG. 19) and a second force concentration bump (153 in FIG. 19) are not provided.

Figure 26:
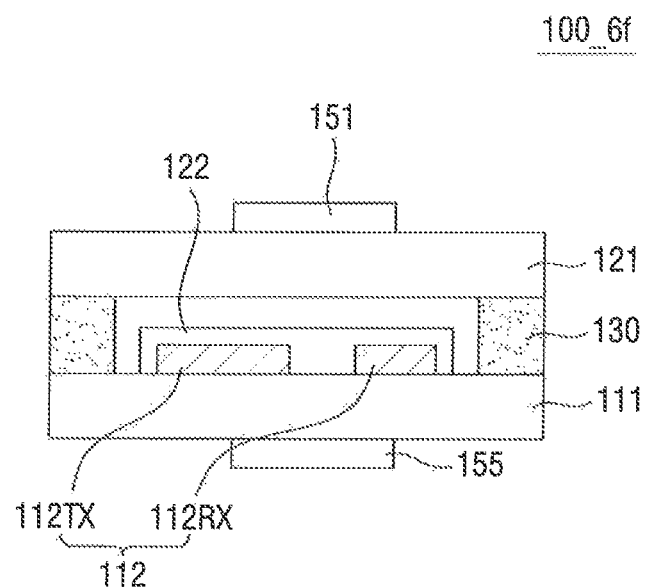

Referring to FIG. 26, a first force sensor 100_6f according to the current embodiment is substantially the same as the embodiment of FIGS. 19 and 20 except that a force sensing layer 122 is located on a surface of a first base 111 and covers a first electrode 112TX and a second electrode 112RX.

Figure 27:
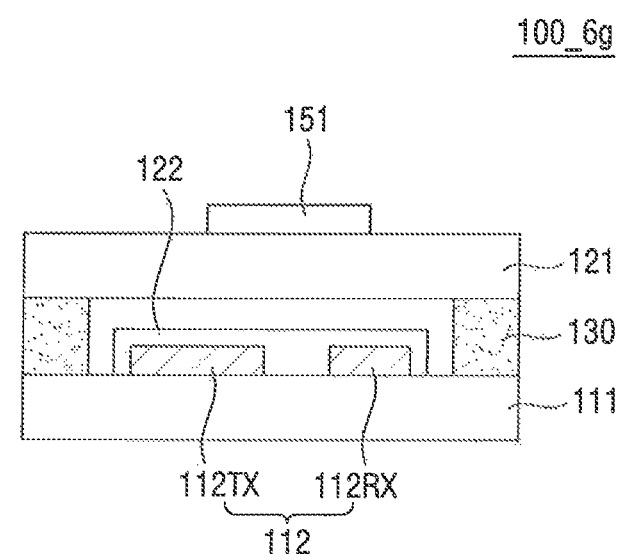

Referring to FIG. 27, a first force sensor 100_6g according to the current embodiment is substantially the same as the embodiment of FIGS. 19 and 20 except that a force sensing layer 122 is located on a surface of a first base 111 and covers a first electrode 112TX and a second electrode 112RX, and third force concentration bumps (155 in FIG. 19) and a fourth force concentration bump (157 in FIG. 19) are not provided.

Figure 28:
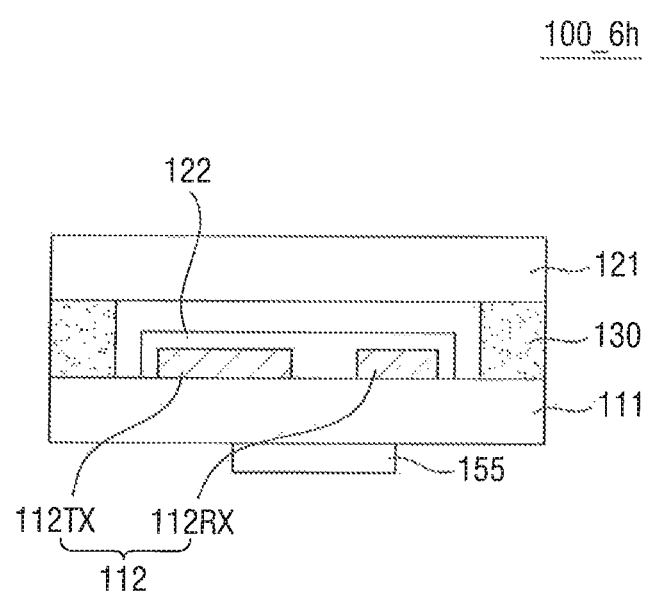

Referring to FIG. 28, a first force sensor 100_6h according to the current embodiment is substantially the same as the embodiment of FIGS. 19 and 20 except that a force sensing layer 122 is located on a surface of a first base 111 and covers a first electrode 112TX and a second electrode 112RX, and first force concentration bumps (151 in FIG. 19) and a second force concentration bump (153 in FIG. 19) are not provided.

Figure 29:
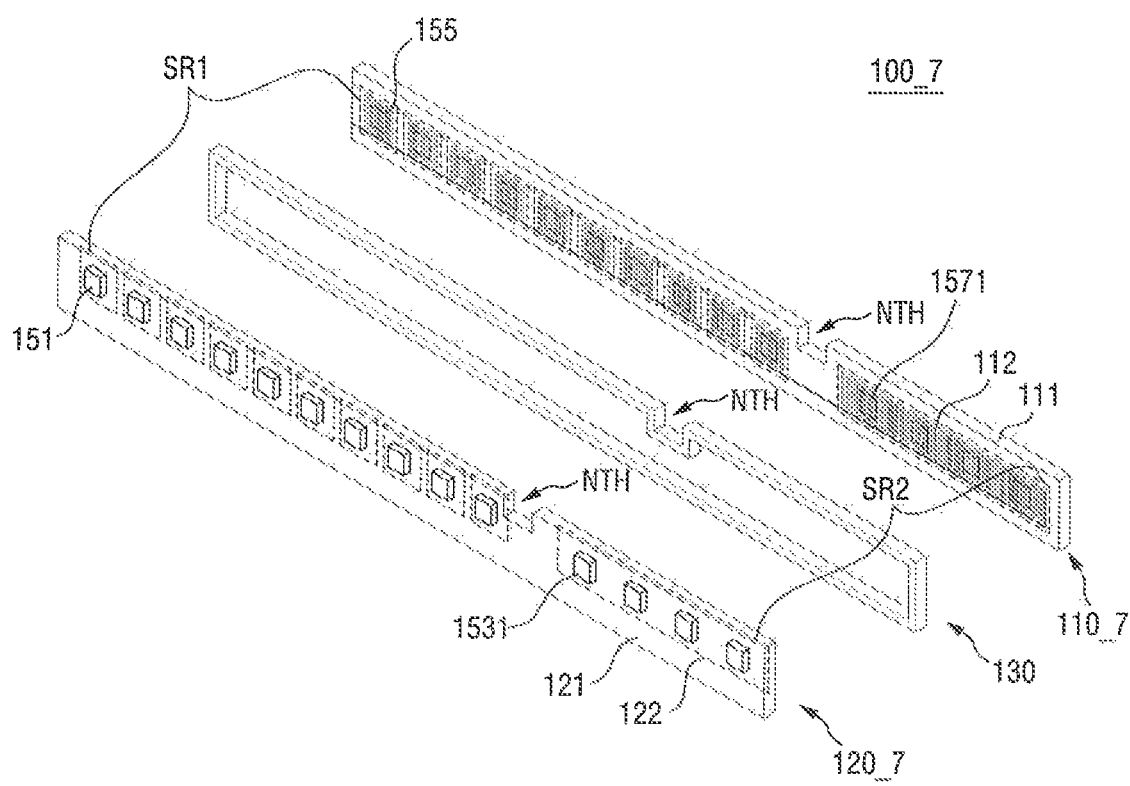
FIG. 29 is an exploded perspective view of a first force sensor according to an exemplary embodiment of the inventive concept.
Figure 30:
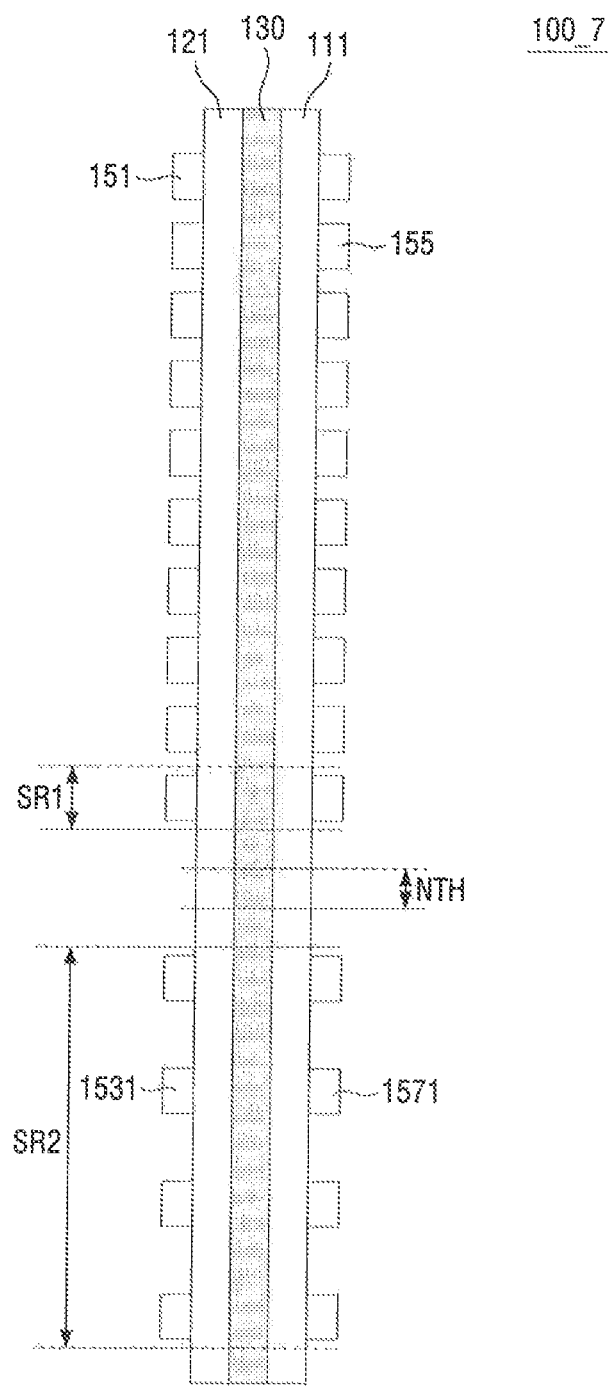
FIG. 30 illustrates the first force sensor of FIG. 29 as viewed from above.

FIG. 29 is an exploded perspective view of a first force sensor 100_7 according to an exemplary embodiment of the inventive concept. FIG. 30 illustrates the first force sensor 100_7 of FIG. 29 as viewed from above. More specifically, FIG. 30 illustrates the first force sensor 100_7 in a state where a first substrate 110_7 and a second substrate 120_7 are bonded together as viewed from above based on FIG. 29.

Referring to FIGS. 29 and 30, the first force sensor 100_7 according to the current embodiment is substantially the same as the embodiment of FIGS. 19 and 20 except that a plurality of second force concentration bumps 1531 and a plurality of fourth force concentration bumps 1571 are provided and spaced apart from each other along one direction. Therefore, a detailed description will be omitted.

Figure 31:
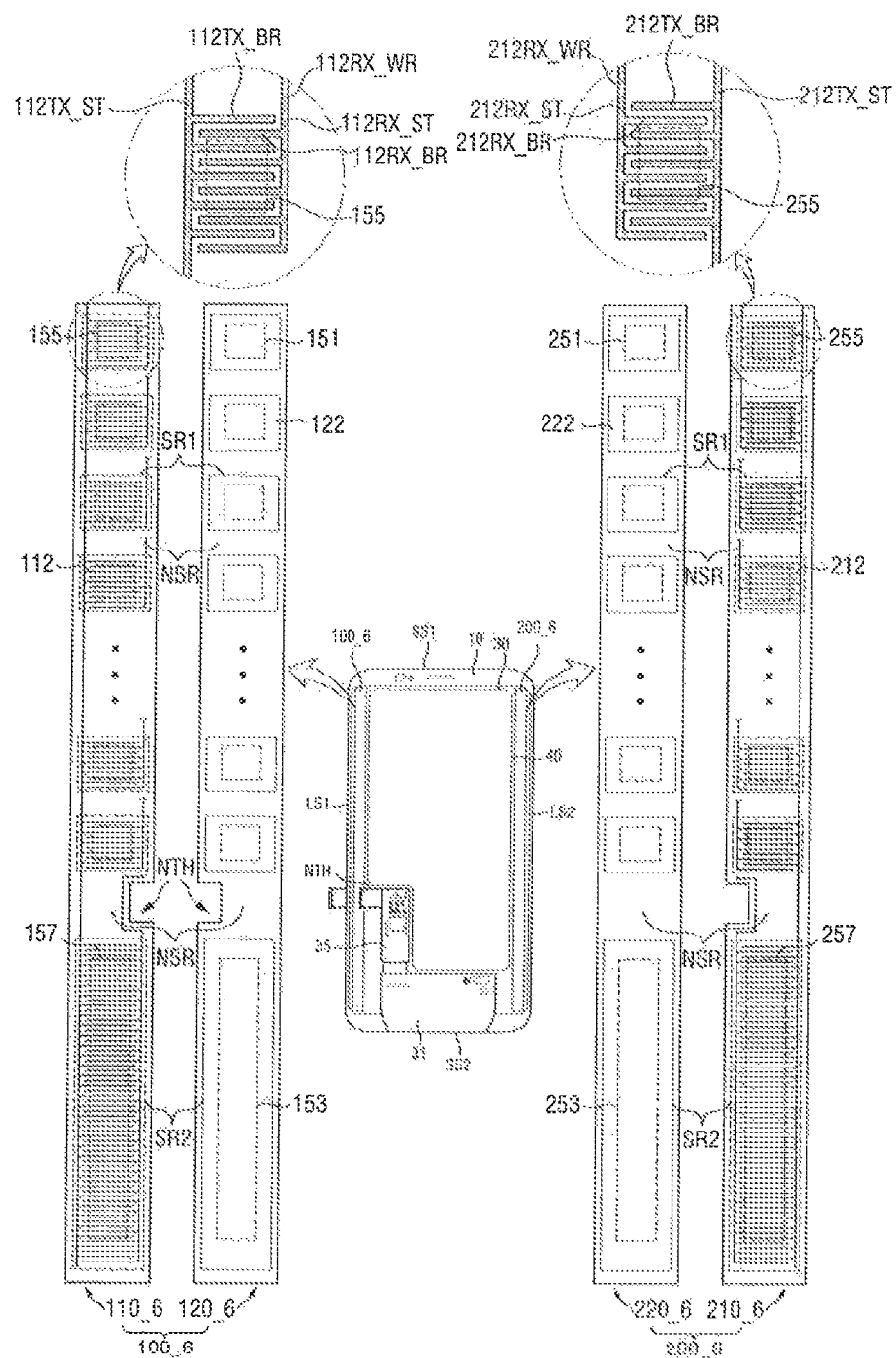
FIG. 31 is a layout view of a first force sensor and a second force sensor according to an exemplary embodiment of the inventive concept.

FIG. 31 is a layout view of a first force sensor 100_6 and a second force sensor 200_6 according to an exemplary embodiment of the inventive concept. More specifically, a layout view of the first force sensor 100_6 of the embodiment illustrated in FIGS. 18 through 20 and the second force sensor 200_6 is substantially similar to the structure illustrated in FIGS. 18 through 20.

A layout view of a first substrate 110_6 and a second substrate 120_6 of the first force sensor 100_6 is illustrated on the left side of FIG. 31, and a layout view of a first substrate 210_6 and a second substrate 220_6 of the second force sensor 200_6 is illustrated on the right side of FIG. 31.

The arrangement of a first electrode 112TX, a second electrode 112RX and a force sensing layer 122 of the first force sensor 100_6, first sensing regions SR1, and a recess NTH are the same as those described above in the embodiment of FIG. 9. In addition, force concentration bumps 151, 153, 155 and 157 of the first force sensor 100_6 are the same as those described above in the embodiment of FIGS. 18 through 20. Therefore, a redundant description will be omitted.

The second force sensor 200_6 may have substantially the same structure as the first force sensor 100_6 except that it does not include a notch-shaped recess NTH.

Briefly, the second force sensor 200_6 includes the first substrate 210_6 and the second substrate 220_6 facing each other. The second substrate 220_6 may include a force sensing layer 222 located on a surface of a second base, fifth force concentration bumps 251 located on the other surface of the second base and respectively overlapping first sensing regions SR1, and a sixth force concentration bump 253 located on the other surface of the second base and overlapping a second sensing region SR2. In addition, the first substrate 210_6 may include first and second electrodes 212TX and 212RX located on a surface of a first base, seventh force concentration bumps 255 located on the other surface of the first base and respectively overlapping the first sensing regions SR1, and an eighth force concentration bump 257 located on the other surface of the first base and overlapping the second sensing region SR2.

In some embodiments, the sensing regions SR1 and SR2 of the first force sensor 100 and the sensing regions SR1 and SR2 of the second force sensor 200 may be substantially symmetrical in terms of number, area, spacing, position, etc. Therefore, the arrangement of the fifth force concentration bumps 251 and the seventh force concentration bumps 255 may be substantially symmetrical to the arrangement of the first force concentration bumps 151 and the third force concentration bumps 155. In addition, the length of the sixth force concentration bump 253 and the length of the eighth force concentration bump 257 may be substantially equal to the length of the second force concentration bump 153 and the length of the fourth force concentration bump 157.

Other specific features of the fifth force concentration bumps 251 are the same as those of the first force concentration bumps 151 described above, other specific features of the sixth force concentration bump 253 are the same as those of the second force concentration bump 153 described above, other specific features of the seventh force concentration bumps 255 are the same as those of the third force concentration bumps 155 described above, and other specific features of the eighth force concentration bump 257 are the same as those of the fourth force concentration bump 157 described above. Therefore, a detailed description will be omitted.

Figure 32:
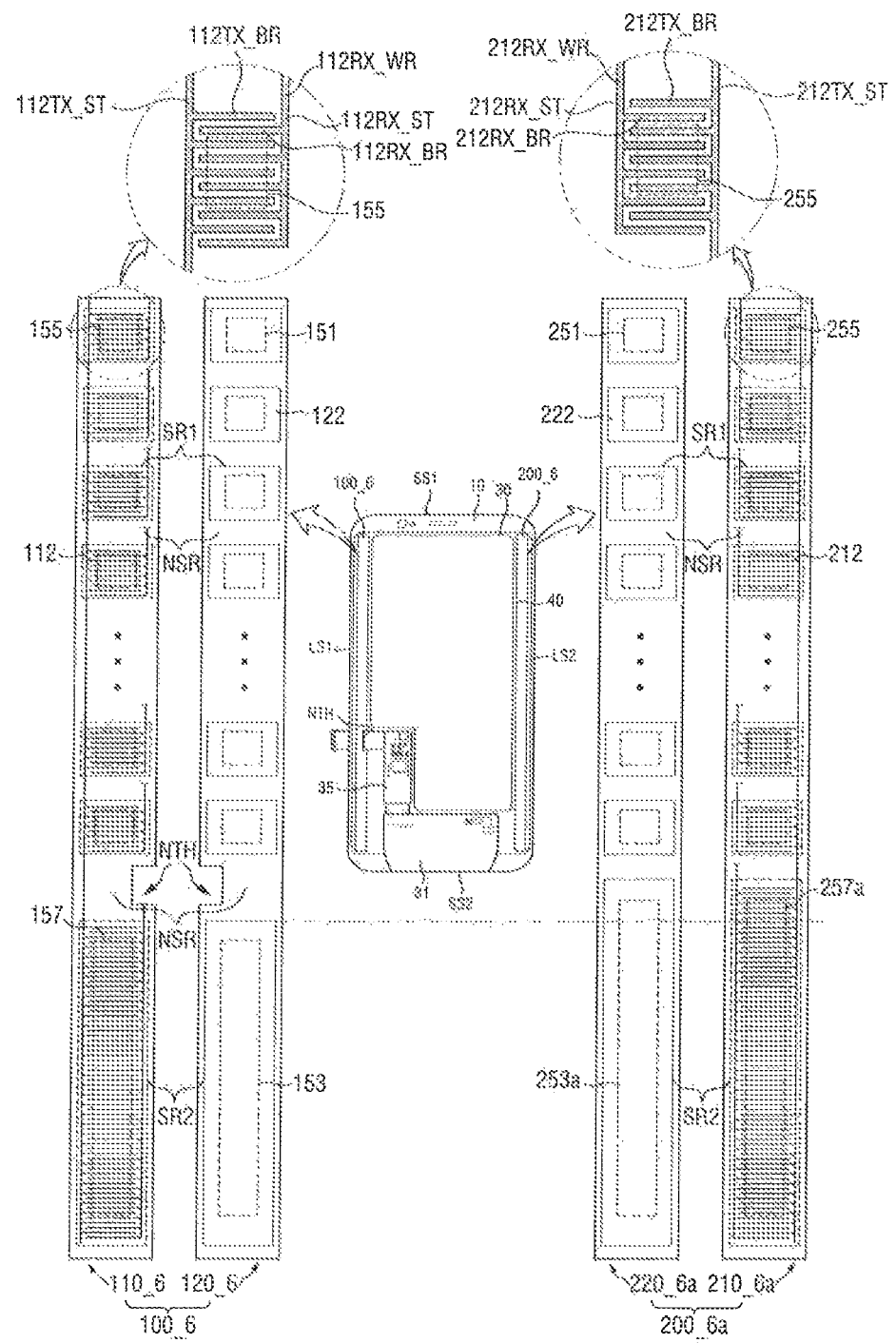
FIG. 32 is a layout view of a first force sensor and a second force sensor according to an exemplary embodiment of the inventive concept.

FIG. 32 is a layout view of a first force sensor 100_6 and a second force sensor 200_6a according to an exemplary embodiment of the inventive concept.

The embodiment of FIG. 32 is different from the embodiment of FIG. 31 in that a second sensing region SR2 of the second force sensor 200_6a has a larger area than a second sensing region SR2 of the first force sensor 100_6, and the length of a sixth force concentration bump 253a included in a second substrate 220_6a of the second force sensor 200_6a and the length of an eighth force concentration bump 257a included in a first substrate 210_6a of the second force sensor 200_6a are greater than the length of a second force concentration bump 153 and the length of a fourth force concentration bump 157. Other features of the second sensing region SR2 of the second force sensor 200_6a are the same as those described in the embodiment of FIG. 12.

Figure 33:
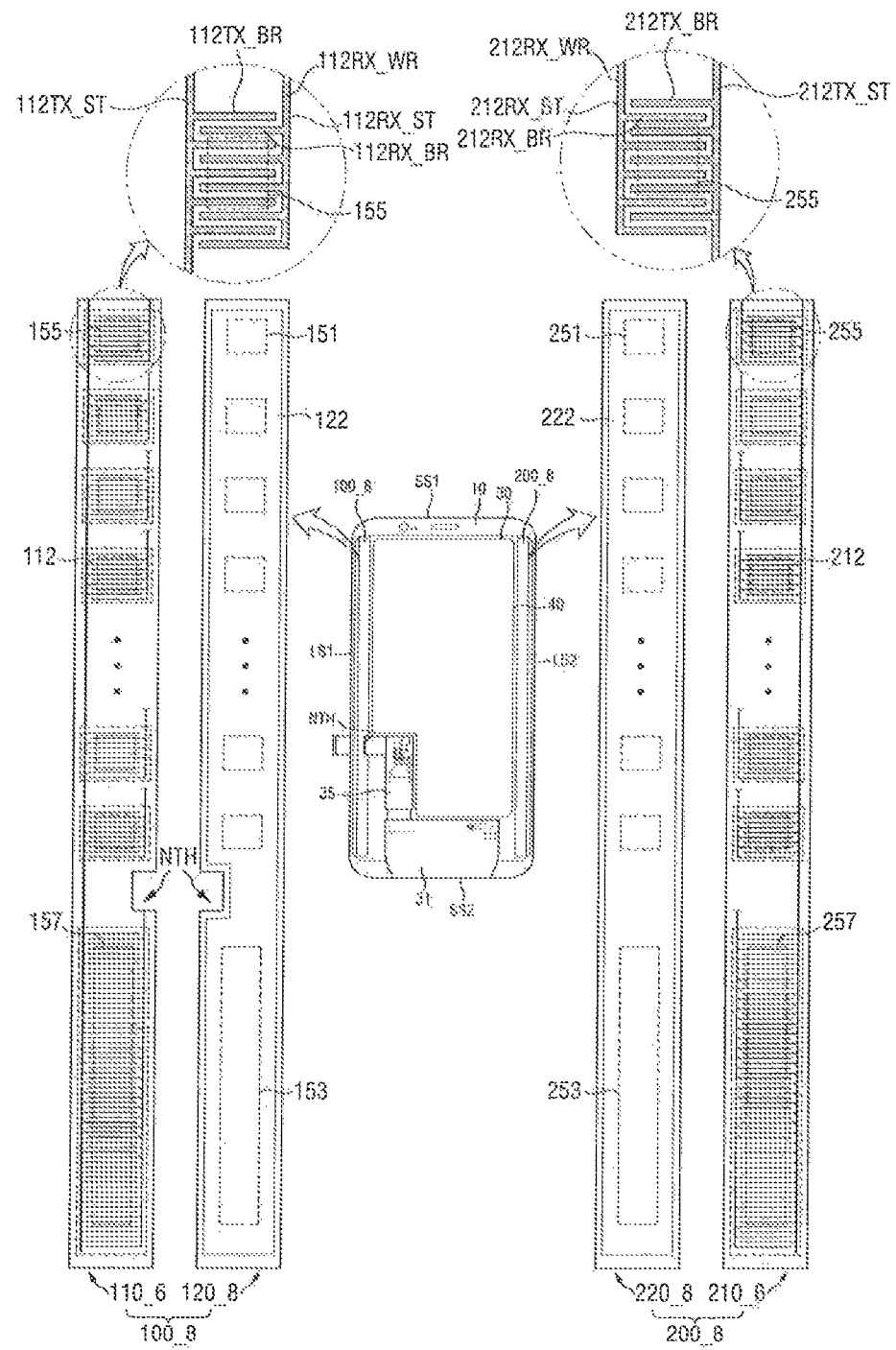
FIG. 33 is a layout view of a first force sensor and a second force sensor according to an exemplary embodiment of the inventive concept.

FIG. 33 is a layout view of a first force sensor 100_8 and a second force sensor 200_8 according to an exemplary embodiment of the inventive concept.

FIG. 33 shows that a force sensing layer 122 or 222 can be formed as a single piece without being divided into segments respectively corresponding to sensing regions SR1 and SR2. The embodiment of FIG. 33 is substantially the same as the embodiment of FIG. 31 except that a second substrate 120_8 or 220_8 of each of the first force sensor 100_8 and the second force sensor 200_8 includes the force sensing layer 122 or 222 formed as a single piece. Other features of the force sensing layer 122 or 222 are the same as those described above in the embodiment of FIG. 13.

Figure 34:
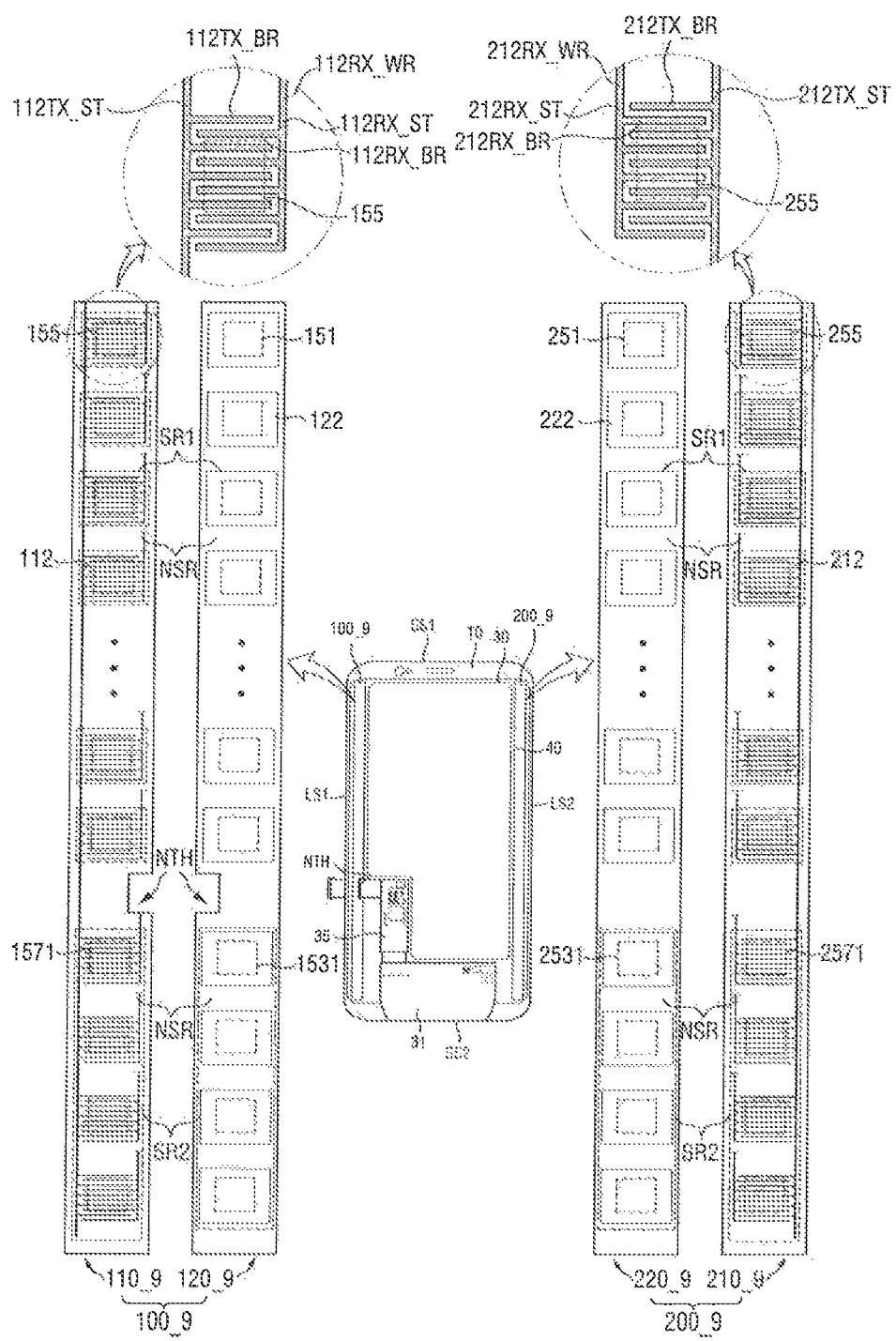
FIG. 34 is a layout view of a first force sensor and a second force sensor according to an exemplary embodiment of the inventive concept.

FIG. 34 is a layout view of a first force sensor 100_9 and a second force sensor 200_9 according to an exemplary embodiment of the inventive concept. The embodiment of FIG. 34 shows that a non-sensing region NSR can be disposed in portions of a second sensing region SR2 of each of the first force sensor 100_9 and the second force sensor 200_9.

Referring to FIG. 34, in the second sensing region SR2 of each of the first and second force sensors 100_9 and 200_9, second branch electrodes 112RX_BR or 212RX_BR of a first substrate 110_9 or 210_9 may be arranged similarly to a plurality of first sensing regions SR1.

The second branch electrodes 112RX_BR or 212RX_BR in the second sensing region SR2 may be electrically connected to each other by one second stem electrode 112RX_ST or 212RX_ST. In addition, a force sensing layer 122 or 222 of a second substrate 120_9 or 220_9 may be patterned as in the first sensing regions SR1.

A plurality of second force concentration bumps 1531 and a plurality of fourth force concentration bumps 1571 may be arranged to respectively overlap segments of the patterned force sensing layer 122 in the second sensing region SR2 of the first force sensor 100_9. Similarly, a plurality of sixth force concentration bumps 2531 and a plurality of eighth force concentration bumps 2571 may be arranged to respectively overlap segments of the patterned force sensing layer 222 in the second sensing region SR2 of the second force sensor 200_9.

However, embodiments of the present disclosure are not limited to the above case, and the force sensing layer 122 in the second sensing region SR2 can be formed as a single piece without being patterned as illustrated in FIG. 31.

More specific features of the first force sensor 100_9 and the second force sensor 200_9 may be substantially the same as those described in the embodiment of FIG. 14.

Figure 35:
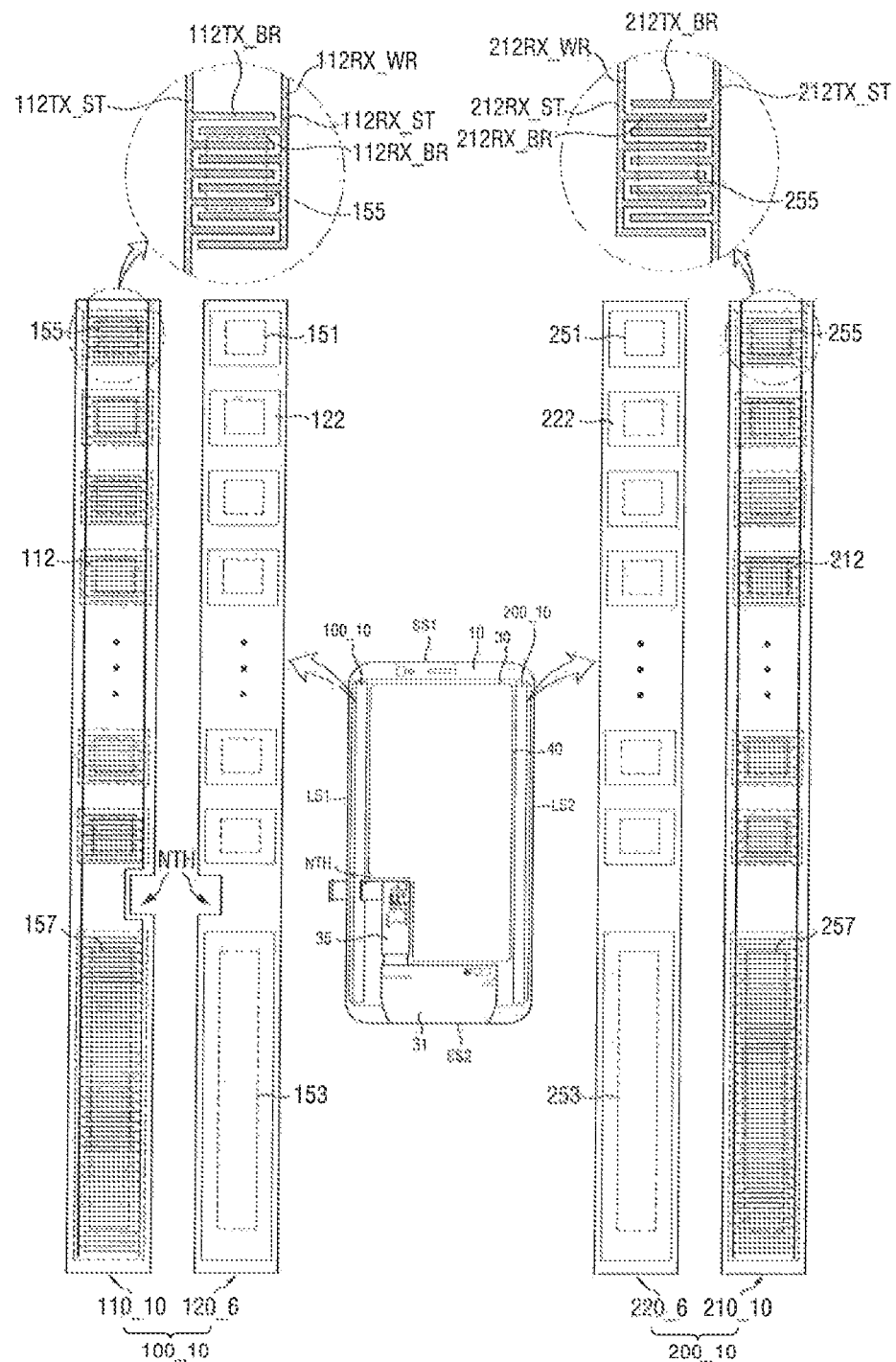
FIG. 35 is a layout view of a first force sensor and a second force sensor according to an exemplary embodiment of the inventive concept.

FIG. 35 is a layout view of a first force sensor 100_10 and a second force sensor 200_10 according to an exemplary embodiment of the inventive concept. The embodiment of FIG. 35 is substantially the same as the embodiment of FIG. 31 except for the structure of a first substrate 110_10 of the first force sensor 100_10 and the structure of a first substrate 210_10 of the second force sensor 200_10.

Referring to FIG. 35, in the current embodiment, all portions of a second electrode 112RX or 212RX are connected by a second stem electrode 112RX_ST or 212RX_ST, like a first electrode 112TX or 212TX. Accordingly, the presence or absence of a force and the magnitude of the force can be measured. In addition, the position where the force has been applied can be identified through the touch member 20 (see FIG. 3). Other specific features are substantially the same as those described above in the embodiment of FIG. 15.

Figure 36:
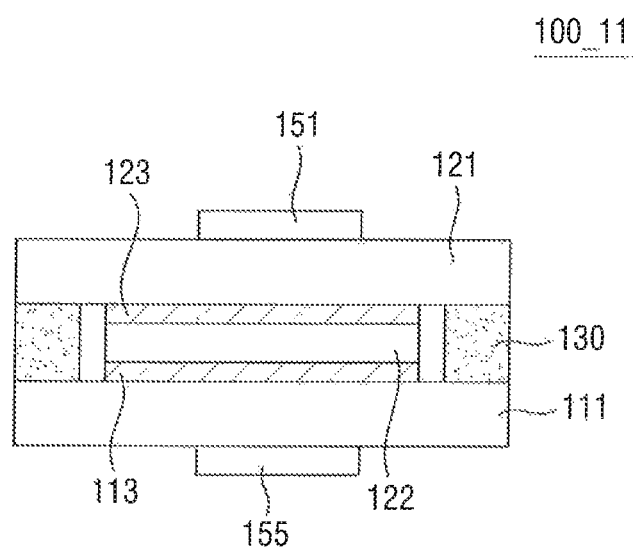
FIG. 36 is a cross-sectional view of a first force sensor according to an exemplary embodiment of the inventive concept.
Figure 37:
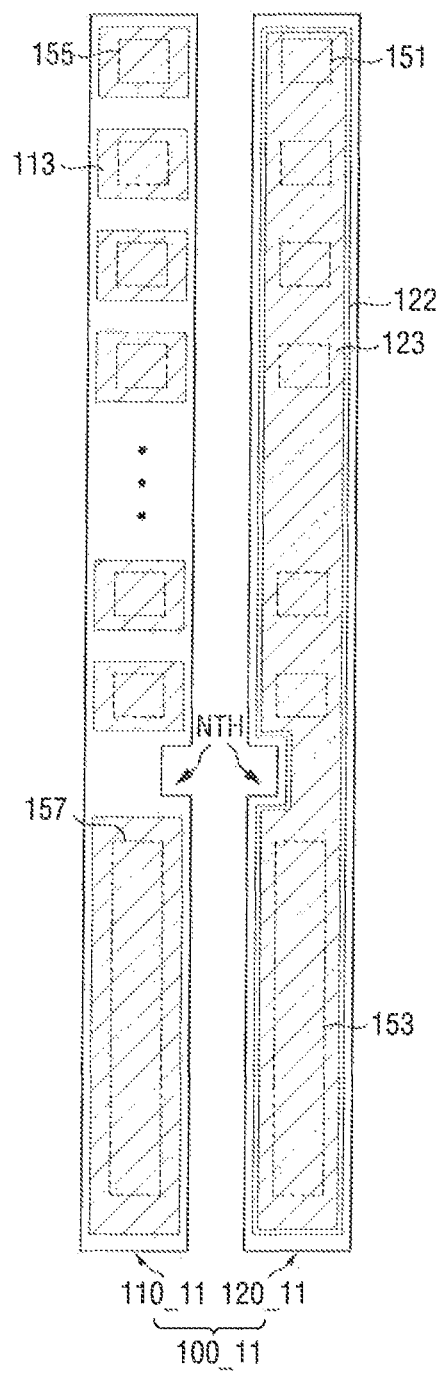
FIG. 37 is a layout view of the first force sensor of FIG. 36.

FIG. 36 is a cross-sectional view of a first force sensor 100_11 according to an exemplary embodiment of the inventive concept. FIG. 37 is a layout view of the first force sensor 100_11 of FIG. 36. Referring to FIGS. 36 and 37, the shape and arrangement of first and second electrodes 113 and 123 of the first force sensor 100_11 according to the current embodiment are different from those of the embodiment of FIG. 31.

Specifically, a first substrate 110_11 includes a first base 111, the first electrode 113 disposed on a surface of the first base 111, and third force concentration bumps 155 and a fourth force concentration bump 157 disposed on the other surface of the first base 111. A second substrate 120_11 includes a second base 121, the second electrode 123 disposed on a surface of the second base 121, a force sensing layer 122 disposed on the second electrode 123, and first force concentration bumps 151 and a second force concentration bump 153 disposed on the other surface of the second base 121. The first electrode 113 faces the force sensing layer 122 and is in contact with or adjacent to the force sensing layer 122.

Other features of the first electrode 113, the second electrode 123 and the force sensing layer 122 are the same as those described above in the embodiment of FIGS. 16 and 17.

Although only the first force sensor 100_11 is illustrated in FIGS. 36 and 37, a second force sensor may have the same structure as the first force sensor 100_11 except for a recess NTH.

Although not illustrated in the drawings, the structures of the first force sensors according to the above-described embodiments can be changed to the structure of each of the embodiments described above with reference to FIGS. 21 through 30, and the structures of the second force sensors can be changed to the structure of each of the embodiments described above with reference to FIGS. 21 through 30, except for the recess NTH.

Figure 38:
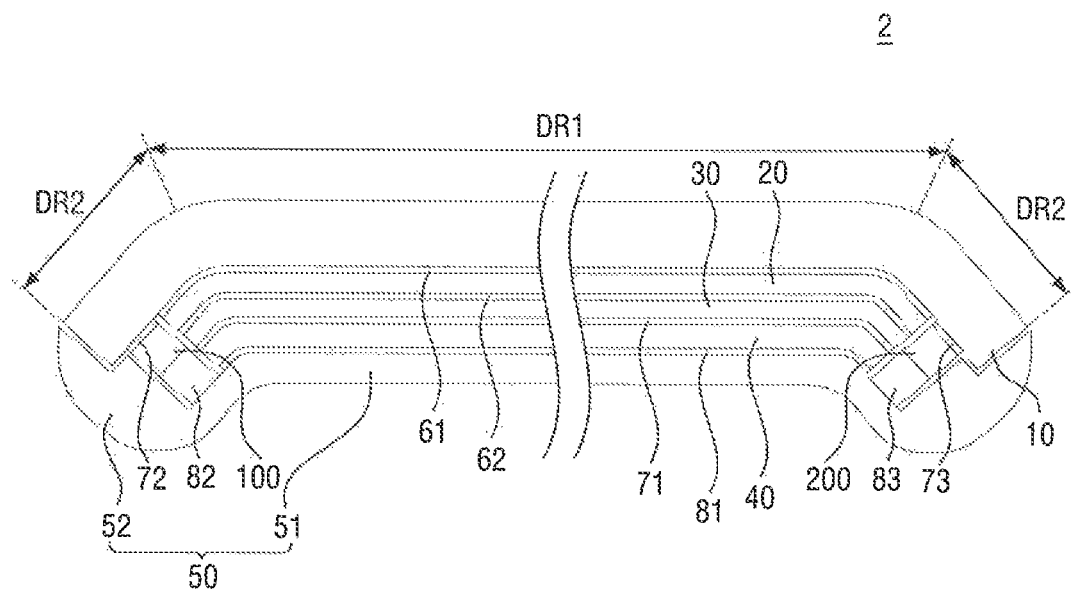
FIG. 38 is a cross-sectional view of a display device according to an exemplary embodiment of the inventive concept.

FIG. 38 is a cross-sectional view of a display device 2 according to an exemplary embodiment of the inventive concept.

FIG. 38 shows that the attachment positions of a first force sensor 100 and a second force sensor 200 in the display device 2 can be changed. That is, as illustrated in FIG. 38, the first force sensor 100 and the second force sensor 200 can be directly attached to a window 10 without overlapping a display panel 30 and a touch member 20.

Figure 39:
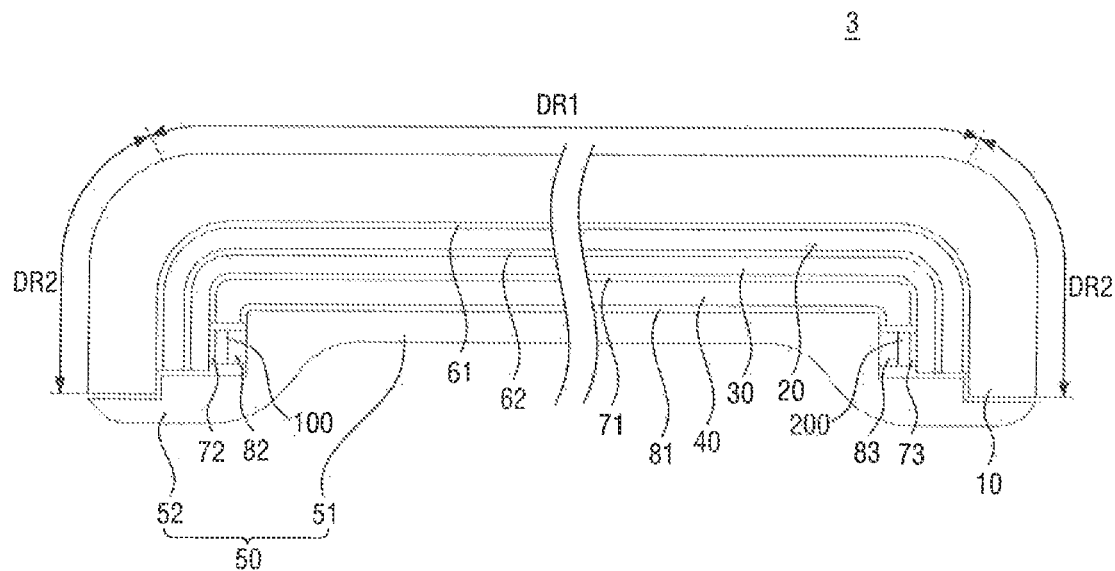
FIG. 39 is a cross-sectional view of a display device according to an exemplary embodiment of the inventive concept.

FIG. 39 is a cross-sectional view of a display device 3 according to an exemplary embodiment of the inventive concept.

FIG. 39 shows that a second area DR2 of the display device 3 can lie in a plane having an angle of 90 degrees or more to a first area DR1. The second area DR2 may substantially form side surfaces of the display device 3. The second area DR2 can be a display surface, but can also be irrelevant to screen display. A first force sensor 100 and a second force sensor 200 are attached to the second area DR2 of the display device 3. Since the first force sensor 100 and the second force sensor 200 are attached to the side surfaces of the display device 3 in the current embodiment, it is possible to more easily make a force input while gripping the display device 3.

Although not illustrated in the drawings, the structures of the first force sensors 100 of the display devices 2 and 3 illustrated in FIGS. 38 and 39 can be changed to the structure of each of the embodiments described above with reference to FIGS. 13 through 30, and the structures of the second force sensors 200 can be changed to the structure of each of the embodiments described above with reference to FIGS. 13 through 30, except for a recess NTH.

A force sensor and a display device according to at least one of the embodiments described above may prevent a malfunction due to interference between components and provide a simpler method for recognizing data inputs.

In addition, a force sensor and a display device according to at least one of the embodiments described above can have improved force sensing sensitivity.

While the present disclosure has been particularly illustrated and described with reference to exemplary embodiments thereof, it will be understood by those of ordinary skill in the art that various changes in form and detail may be made therein without departing from the spirit and scope of the present disclosure.

What is claimed is:

1. A display device comprising:
a display panel; and
a first force sensor disposed adjacent to a first edge of the display panel, the first force sensor extending along the first edge,
wherein the first force sensor comprises:
a first sensing region;
a second sensing region located on a side of the first sensing region and having a larger area than the first sensing region;
a first force concentration bump overlapping the first sensing region; and
a second force concentration bump overlapping the second sensing region and spaced apart from the first force concentration bump,
wherein the first force sensor comprises a first electrode and a plurality of second electrodes separated from the first electrode, wherein the first electrode is disposed over the first sensing region and the second sensing region, and the second electrodes are disposed separately in each of the first sensing region and the second sensing region.

2. The display device of claim 1, wherein a length of the second force concentration bump is greater than a length of the first force concentration bump.

3. The display device of claim 1, wherein the second force concentration bump is one of a plurality of second force concentration bumps spaced apart from each other and arranged along a first direction.

4. The display device of claim 1, wherein the first force sensor further comprises a force sensing layer comprising a force sensitive material having a resistance that varies according to a force, wherein the force sensing layer overlaps the first force concentration bump, the first electrode and the second electrode in the first sensing region and wherein the force sensing layer overlaps the second force concentration bump, the first electrode and the second electrode in the second sensing region.

5. The display device of claim 4, wherein the first sensing region is one of a plurality of first sensing regions arranged from a first end of the first force sensor toward a second end of the first force sensor, the second sensing region is located closer to the second end among the first and second ends, and the first force concentration bump is one of a plurality of first force concentration bumps arranged to overlap the first sensing regions, respectively.

6. The display device of claim 5, wherein at least two neighboring first sensing regions among the first sensing regions form a sensing region group configured to execute a preset operation in response to a physical force applied to the sensing region group.

7. The display device of claim 4, wherein the first electrode and the second electrodes are located at a same level, the force sensing layer is located on the first electrode and the second electrodes, and the first force concentration bump and the second force concentration bump are located on the force sensing layer.

8. The display device of claim 7, wherein the first force concentration bump and the second force concentration bump are made of a same material as the force sensing layer.

9. The display device of claim 7, wherein the first force sensor further comprises a first base and a second base facing the first base, the first electrode and the second electrodes are located on a surface of the first base which faces the second base, the force sensing layer is located on a surface of the second base which faces the first base, and the first force concentration bump and the second force concentration bump are located on the other surface of the second base.

10. The display device of claim 9, wherein the first force sensor further comprises a third force concentration bump and a fourth force concentration bump which are located on the other surface of the first base and are spaced apart from each other, wherein the third force concentration bump overlaps the first sensing region, the fourth force concentration bump overlaps the second sensing region, and the third force concentration bump and the fourth force concentration bump are made of a same material as the first electrode and the second electrode.

11. The display device of claim 4, wherein the first electrode and the second electrode are located at a same level, the force sensing layer is located on the first electrode and the second electrodes, and the first force concentration bump and the second force concentration bump are located below the first electrode and the second electrodes.

12. The display device of claim 11, wherein the first force sensor further comprises a first base and a second base facing the first base, the first electrode and the second electrodes are located on a surface of the first base which faces the second base, the force sensing layer is located on a surface of the second base which faces the first base, and the first force concentration bump and the second force concentration bump are located on the other surface of the first base.

13. The display device of claim 12, wherein the first force concentration bump and the second force concentration bump are made of a same material as the first electrode and the second electrode.

14. The display device of claim 4, wherein the first electrode comprises a first stem electrode and a plurality of first branch electrodes branching from the first stem electrode, and each of the second electrodes comprises a second stem electrode and a plurality of second branch electrodes branching from the second stem electrode, wherein the first branch electrodes and the second branch electrodes are arranged alternately with each other.

15. The display device of claim 14, wherein the first electrode is a driving electrode, and each of the second electrodes is a sensing electrode.

16. The display device of claim 4, wherein the force sensing layer is disposed separately in each of the first sensing region and the second sensing region.

17. The display device of claim 4, wherein the first electrode and the second electrodes are located at different levels, and the force sensing layer is located between the first electrode and the second electrodes.

18. The display device of claim 1, further comprising:
a second force sensor disposed adjacent to a second edge facing the first edge of the display panel, and the second force sensor extending along the second edge,
wherein the second force sensor comprises:
a plurality of third sensing regions arranged from a first end of the second force sensor toward a second end of the second force sensor;
a fourth sensing region located closer to the second end among the first and second ends, the fourth sensing region having a larger area than each of the third sensing regions;
a third force concentration bump overlapping each of the third sensing regions; and
a fourth force concentration bump overlapping the fourth sensing region, the fourth concentration bump spaced apart from the third force concentration bump.

19. The display device of claim 18, comprising a flat portion, a first curved portion disposed at the first edge of the flat portion, and a second curved portion disposed at the second edge of the flat portion, wherein the first force sensor is disposed in the first curved portion, and the second force sensor is disposed in the second curved portion.

20. The display device of claim 19, wherein the first force sensor and the second force sensor are attached to a lower surface of the display panel.

21. The display device of claim 20, further comprising a bracket which houses the display panel, the first force sensor and the second force sensor, wherein the first force sensor and the second force sensor are attached to the bracket with waterproof tapes, respectively.

22. A display device comprising:
a display panel; and
a first force sensor disposed adjacent to a first edge of the display panel, extending along the first edge, and comprising a recess disposed at an inner side of the first force sensor,
wherein the first force sensor comprises:
a plurality of first sensing regions disposed on a first side of the recess;
a second sensing region disposed on a second side of the recess and having a larger area than each of the first sensing regions;
a first force concentration bump disposed on the first side of the recess and overlapping each of the first sensing regions; and
a second force concentration bump overlapping the second sensing region and having a larger area than the first force concentration bump,
the display device further comprising a bracket which houses the display panel and the first force sensor, the bracket comprising a connect hole through which a connector passes, wherein the recess bypasses the connect hole in an outward direction.

23. The display device of claim 22, wherein the recess is notch-shaped.

24. The display device of claim 22, further comprising:
a second force sensor disposed adjacent to a second edge facing the first edge of the display panel,
wherein the second force sensor comprises:
a plurality of third sensing regions arranged from a first end of the second force sensor toward a second end of the second force sensor;
a fourth sensing region located closer to the second end among the first and second ends and having a larger area than each of the third sensing regions;
a third force concentration bump overlapping each of the third sensing regions; and
a fourth force concentration bump overlapping the fourth sensing region and spaced apart from the third force concentration bump.

25. A force sensor comprising:
a plurality of first sensing regions disposed on a first side of a recess of the force sensor, the first sensing regions configured to sense application of a force;
a second sensing region disposed on a second side of the recess, the second sensing region configured to sense application of a force, and having a larger area than each of the first sensing regions;
a first force concentration bump overlapping each of the first sensing regions;
a second force concentration bump overlapping the second sensing region and spaced apart from the first force concentration bump; and
an electrode layer and a force sensing layer overlapping the electrode layer,
wherein the first force concentration bump overlaps the electrode layer and the force sensing layer in each of the first sensing regions, and the second force concentration bump overlaps the electrode layer and the force sensing layer in the second sensing region.

26. The force sensor of claim 25, wherein an area of the first force concentration bump is smaller than an area of each of the first sensing regions, and an area of the second force concentration bump is smaller than an area of the second sensing region.

27. The force sensor of claim 25, wherein the first force concentration bump and the second force concentration bump are made of a same material as the electrode layer or the force sensing layer.

28. The force sensor of claim 25, wherein the electrode layer comprises a first electrode and a second electrode separated from the first electrode, wherein the first electrode is disposed over the first sensing regions and the second sensing region, the second electrode is one of a plurality of second electrodes disposed separately in each of the first and second sensing regions.

29. A display device comprising:
a display panel; and
a first force sensor disposed adjacent to a first edge of the display panel, the first force sensor extending along the first edge,
wherein the first force sensor comprises:
a first sensing region comprising a first sensing electrode;
a second sensing region located on a side of the first sensing region, the second sensing region comprising a second sensing electrode having a larger area than the first sensing electrode;

a first force concentration bump overlapping the first sensing electrode; and
a second force concentration bump overlapping the second sensing electrode and spaced apart from the first force concentration bump.

\* \* \* \* \*